United States Patent
Alrod et al.

(10) Patent No.: US 8,099,652 B1
(45) Date of Patent: Jan. 17, 2012

(54) NON-VOLATILE MEMORY AND METHODS WITH READING SOFT BITS IN NON UNIFORM SCHEMES

(75) Inventors: Idan Alrod, Herzliya (IL); Eran Sharon, Rishon Lezion (IL); Toru Miwa, Kanagawa (JP); Gerrit Jan Hemink, Kanagawa (JP); Yee Lih Koh, Milpitas, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 12/978,322

(22) Filed: Dec. 23, 2010

(51) Int. Cl.
*G11C 29/00* (2006.01)
(52) U.S. Cl. .......................... 714/773; 714/768; 714/763
(58) Field of Classification Search .................. 714/773, 714/702, 703, 718, 763, 768
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,287 A | 1/2000 | Itoh et al. |
| 6,046,935 A | 4/2000 | Takeuchi et al. |
| 6,222,762 B1 | 4/2001 | Guterman et al. |
| 6,714,449 B2 * | 3/2004 | Khalid ..................... 365/185.03 |
| 6,751,766 B2 | 6/2004 | Guterman et al. |
| 7,023,735 B2 | 4/2006 | Ban et al. |
| 7,301,807 B2 * | 11/2007 | Khalid et al. ............ 365/185.03 |
| 7,436,733 B2 | 10/2008 | Mokhlesi |
| 7,551,237 B2 | 6/2009 | Numata et al. |
| 7,609,556 B2 * | 10/2009 | Chan ........................ 365/185.22 |
| 7,729,165 B2 * | 6/2010 | Wang ....................... 365/185.03 |
| 2007/0283227 A1 | 12/2007 | Sharon et al. |

FOREIGN PATENT DOCUMENTS

WO     WO 2008/042593 A1     4/2008

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Shannon, "A mathematical theory of communications", Bell Syst. Tech, J. vol. 2, pp. 379-423,623-656, Jul., Oct. 1948.

* cited by examiner

*Primary Examiner* — Fritz Alphonse
(74) *Attorney, Agent, or Firm* — Davis Wright Tremaine LLP

(57) ABSTRACT

A non-volatile memory has its cells' thresholds programmed within any one of a first set of voltage bands partitioned by a first set of reference thresholds across a threshold window. The cells are read at a higher resolution relative to a second set of reference thresholds so as to provide additional soft bits for error correction. The reference thresholds of the second set are set up to be non-uniformly distributed on the threshold window so as to provide higher resolution at designated regions. At the same time they are conducive to be read in groups for soft bits to be read bit-by-bit systematically with a simple algorithm and read circuit and using a minimum of data latches. This is accomplished by relaxing the requirement that the first set of reference threshold is a subset of the second set and that the resulting soft bits are symmetrically distributed about the hard bits.

20 Claims, 16 Drawing Sheets 2-bit Memory with 2HB nested and 2 SB Read 2-bit Memory with 2HB & 2 SB Asymmetric & not Nested;
12 Read Points - mirrored 2-bit Memory with 2 HB Nested & 1.5 SB; 9 Read Points 2-bit Memory with 2 HB & 2 SB Not Nested; 15 Read Points

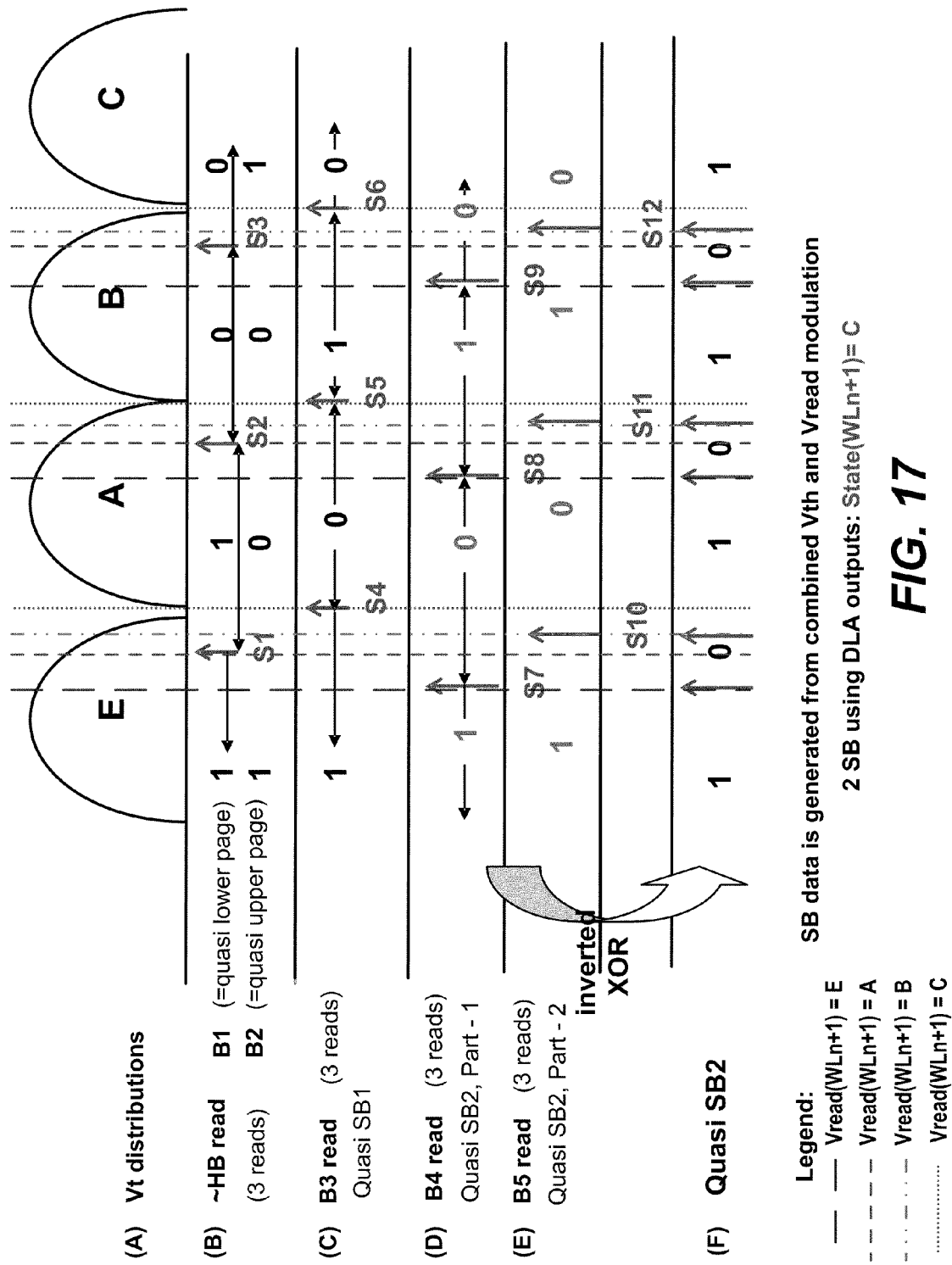

NON-VOLATILE MEMORY AND METHODS WITH READING SOFT BITS IN NON UNIFORM SCHEMES

CROSS REFERENCE TO RELATED APPLICATIONS

This application is also related to the following U.S. Patent Applications: U.S. application Ser. No. 12/978,348, entitled "Non-Volatile Memory And Methods With Asymmetric Soft Read Points Around Hard Read Points" by Alrod et al., filed on Dec. 23, 2010. U.S. application Ser. No. 12/978,368, entitled "Non-Volatile Memory And Methods With Soft-Bit Reads While Reading Hard Bits With Compensation For Coupling" by Alrod et al., filed on Dec. 23, 2010.

Any and all patents, patent applications, articles, and other publications and documents referenced herein are hereby incorporated herein by those references in their entirety for all purposes. To the extent of any inconsistency or conflict in the definition or use of terms between the present provisional application and any incorporated patents, patent applications, articles or other publications and documents, those of the present application shall prevail.

FIELD AND BACKGROUND OF THE INVENTION

The present invention relates to storage of data in nonvolatile memories such as flash memories and, more particularly, to a memory and methods of reading using optimized placement of threshold levels for reading hard and soft bits.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash memory typically comprises of EEPROM (Electrically Erasable and Programmable Read-Only Memory). It is a non-volatile memory that can be erased and have new data written or "programmed" into their memory cells. Each memory cell is formed by a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range or voltage bands within the threshold window may, in principle, be used to designate a definite memory state of the cell. In general, when the threshold window is partitioned into $2^m$ voltage bands by $2^m-1$ demarcation reference threshold voltages, the cell can store up to m bits of data. For example, when the threshold voltage is partitioned into two distinct voltage bands, each memory cell will be able to store one bit of data. Similarly, when the threshold voltage window is partitioned into more than two distinct voltage bands, each memory cell will be able to store more than one bit of data.

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

In order to increase memory capacity, flash memory devices are being fabricated with higher and higher density as the state of the semiconductor technology advances. Another method for increasing storage capacity is to have each memory cell store more than two states.

Originally, flash memories stored only one bit per cell. Flash memories that store two bits per cell now are available commercially, and flash memories that store more than two bits per cell are being developed. Flash memories that store one bit per cell are called "Single Level Cell" (SLC) memories. Flash memories that store more than one bit per cell are called "multi-state" or "Multi Level Cell" (MLC) memories.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also flash memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

The reference voltages demarcating the voltage bands of the threshold window for programming references can be considered as "hard" reference voltages (also equivalently referred to as "integral reference voltages" or "integral reference thresholds"). Programming a memory cell aims to place its threshold in the middle of one of the voltage bands or at least within the boundaries of the voltage band. Reading with respect to these hard reference thresholds will yield corresponding hard bits (HB). When the memory is programmed with sufficient margin between the various voltage bands, the distribution of programmed threshold levels in each voltage band is well defined. Thus, reading with respect to the hard reference thresholds are adequate in locating each programmed threshold of the cells accurately.

In practice, the distribution about each voltage band has a spread and there is a finite probability that some member of a distribution strayed over to a neighboring voltage band. In that case, the hard read levels will yield erroneous read results. A common practice is to incorporate an error correction code ("ECC") computed on the hard bits to correct errors that may crop up.

With the desire to produce memory with higher density, each generation of memory device is fabricated with more integration, resulting in the memory cells being closer to each other. This has created issues with increased interactions and perturbations between cells, resulting in the further spreading of the distribution of programmed threshold levels in each voltage band. Furthermore, the problem is exacerbated by the implementation of MLC storage, in which more and more bits are crammed into each cell. This results in having to partition the fixed threshold windows into more and more voltage bands, thereby requiring the distribution of programmed threshold levels in each band and the margins between bands to be narrower.

The threshold voltages of the cells are distributed statistically around the centers of their respective voltage bands. There are several reasons for the finite widths of these distributions. The programming process is a stochastic one that relies on inherently stochastic processes such as quantum mechanical tunneling and hot injection. The precision of the read/program circuitry is finite and is also limited by random noise. In some flash technologies, the threshold voltage of a cell being read is affected by the threshold voltages of neighboring cells. Chip-to-chip variations and variations in the manufacturing process cause some cells to behave differently than other cells when read/programmed. Furthermore, the cell threshold voltage distributions tend to change over time. As a flash memory is programmed and erased, the sizes of the voltage window and the voltage bands tend to change. These phenomena limit the number of times a MLC flash memory can be erased and re-programmed. Also, the threshold voltage of a flash cell that is not programmed for a long time tends to drift to a lower threshold voltage. This phenomenon limits the time that data can be reliably retained in a flash memory.

The voltage bands of a flash cell should be designed to be wide enough to accommodate all these phenomena, but not too wide. A voltage band that is too narrow, relative to the associated threshold voltage distribution curve and relative to the drift of that curve over time, leads to an unacceptably high bit error rate. Making the voltage bands very wide relative to the associated threshold voltage distributions limits the number of bits in the bit patterns that can be stored reliably in the flash cell. In practice, flash memories are designed to have one error per $10^{14}$-$10^{16}$ bits read. Some flash technologies are unable to achieve this error rate while storing the desired number of bits per cell. Some flash memories based on such technology use error correction circuits to compensate for their high intrinsic error rates.

The use, in addition to integral reference thresholds, of other reference thresholds that lie within voltage bands, allows the programmed threshold of a cell to be located at a higher resolution within the threshold window. Such reference thresholds are termed "fractional reference thresholds" or "fractional reference voltages" herein. With the additional fractional reference thresholds, the threshold window is resolvable into more voltage bands, which are codable by additional bits, known as "soft bits". These soft bits will help to improve the performance of the ECC operation.

Soft bit (SB) readings (also known as 'resolution bits') in flash memory devices have already been introduced in the past in connection with improving the reliability and operation of an algebraic ECC decoder by allowing it to perform bit flips on less reliable bits. For example, U.S. Pat. No. 6,751, 766 and U.S. Pat. No. 7,023,735 disclose using soft bits to improve the correction capability of an ECC decoder. Another example in which resolution bits are employed to improve upon the operation of a soft input decoder is detailed in WO 2008/042593 A1.

It is therefore desirable to partition the threshold window of a memory cell in an optimal manner to yield additional soft bits that are efficient in correcting errors and efficient to handle.

SUMMARY OF THE INVENTION

The invention suggests specific methods for optimized ways in which soft bits (SB) are read from a flash device. The number of read sensing is not necessarily in the form of $2^L-1$, where L is the number of bits stored by each memory cell, and the placement of the threshold levels associated with the soft bits across the threshold window is made in a non uniform manner.

Non-Volatile Memory and Methods with Reading Soft Bits in Non Uniform Schemes which Employs a Set of Read Thresholds in which Hard Bits are not Nested within Soft Bits According to a first aspect of the invention, in a memory having a threshold window and is programmable with respect to a first set of reference thresholds for partitioning the threshold window into a first set of threshold voltage bands, a scheme of reading the memory includes providing a second set of reference thresholds that are distributed non-uniformly across the threshold window for partitioning the threshold window into a second set of threshold voltage bands, so that a region of the threshold window where a higher number of errors occurs has a higher density of reference thresholds, and the first set of reference thresholds is not a subset of the second set of reference thresholds. The scheme of reading the memory further includes determining the programmed threshold of the memory relative to one of the second set of threshold voltage bands.

This scheme amounts to the hard bits logically associated with defining the partitioning of the threshold window during programming are not nested within the soft bits associated with a more refined and non-uniform partitioning of the threshold window during reading. The first set of reference thresholds defining a first partition of the threshold window during programming is not a subset of a second set of reference thresholds defining a second partition of threshold window during reading. The second set may include none or only some of the reference thresholds of the first set.

This is accomplished by specific manner of setting the second set of reference thresholds for reading in order to include a number of features. A first feature is non-uniform SB (soft bit) read where the reference thresholds are non-uniformly distributed. This allow for catering to at least two different regions of Cell Error Rate (CER) among the threshold window. In each region a different resolution of the Soft Bits (SB) is required, e.g. the number of read sensing required in order to successfully decode bits stored in cells attributed to word lines (WL's) in the high CER region is larger than the number of read sensing required in order to successfully decode bits stored in cells attributed to WL's in the lower CER region.

Thus, upon using non-uniform readings of SB (Soft Bits) for each number of read points (Vth) selected from the second set, the actual read thresholds can be optimized independently. Furthermore, the inventive scheme relaxes the requirement for the hard bits to be nested so as to maximize the optimal placement of all the read thresholds across the threshold window of the memory.

Non-Volatile Memory and Methods with Asymmetric Soft Read Points Around Hard Read Points According to another aspect of the invention, a memory having a threshold window is read relative to L–1 read points (reference thresholds), where "L" is the total number of different states programmed to the device and is related to the number of bits x programmed to each cell by $2^x >= L$ (e.g., L=4 for a 2 bits per cell, L=8 for a 3 bits per cell device). A set of read thresholds associated with hard bits 'x' and soft bits 'y' is defined across the threshold window is associated with a set of reference thresholds L+M−1 such that $2^{(x+y)} >= L+M$. The set of reference thresholds L+M−1 is arranged into similar subsets of read thresholds that are related to each other subset by an integral offset.

The set of read reference thresholds associated with the bits (HB+SB) or 'x+y' bits gives rise in general to a total of 'L+M−1' sensing operations. There no longer exists a clear separation between hard and soft bits. The set of reference thresholds are designed for grouping into similar subsets, so that a read cycle of reading relative to a subset yields one bit of the x+y bits. This manifests as the reference thresholds in the set associated with soft bits not symmetrically located around that of the hard bits.

In a preferred embodiment the distance between the different read point or thresholds (Vth) within the set of L−1 thresholds is preferably kept the same for each set of L−1 sense cycles while the shift or offset of the thresholds between different sense cycles is an integer multiplication of a basic unit shift defined as ΔR.

In other embodiments, the distance between each subsequent read threshold level in a sense cycle does not have to be the same.

The advantage is that the x+y bits can be obtained bit-by-bit in each read cycle, thereby using one latch per cell. Furthermore, each read cycle of a subset conforms to a similar format and algorithm, thereby allowing the use of a simple, standardized read circuit.

Soft-Bit Reads while Reading Hard Bits with DLA Compensation for Coupling

Accordingly to another aspect of the invention, the soft bits are generated by a combination of a first modulation of voltage on a current word line WLn and a second modulation of voltage on an adjacent word line WLn+1. For example, a first set of read points $V_1, V_2, \ldots, V_i$ for hard bits is set up by modulating WLn while WLn+1 is set to a first predetermined voltage such as Vread. A second set of read points for soft bits is set up as offsets to the first set by also modulating WLn+1 to different Vread values.

This aspect of the invention is particularly synergistically with a known read technique referred to as DLA ("Direct Look-ahead) read. The scheme modulates Vread on WLn+1 in order to read hard bits of memory cells on a current word line, WLn. For the case of 4 states and two bits per cell (e.g. D2) when the read operation employs DLA then each sense operation on WLn is performed 4 times. The read at each of the 3 read reference points Vth1, Vth2 and Vth3 on WLn are repeated 4 times, each time with a different Vread on WLn+1. Only one of these sense operations is separately selected for each cell in WLn according to the state programmed to WLn+1 in order to determine the state of the cell in WLn.

The advantage of the invention is the increase of read speed and reduced energy consumption when better matching the required correction capability of the controller to the data located in the flash device. Another positive outcome is that this advantage is provided W/O increasing the digital circuits required in the flash device with higher cost unlike the digital circuits in the controller for which cost is reduced when digital technology shrinks according with the advance in the lithography generation.

Additional features and advantages of the present invention will be understood from the following description of its preferred embodiments, which description should be taken in conjunction with the accompanying drawings.

BRIEF DESCRIPTION OF THE DRAWINGS

FIGS. 17(A)-17(F) illustrate an alternative example of the read levels and threshold voltage distributions of a 2-bit memory using 12 read points in which the read points are set by a combination of voltage modulations of both WLn and WLn+1, and the neighboring state on WLn+1 is at state 'C'.

DESCRIPTION OF THE PREFERRED EMBODIMENTS

Memory System

Figure 1:
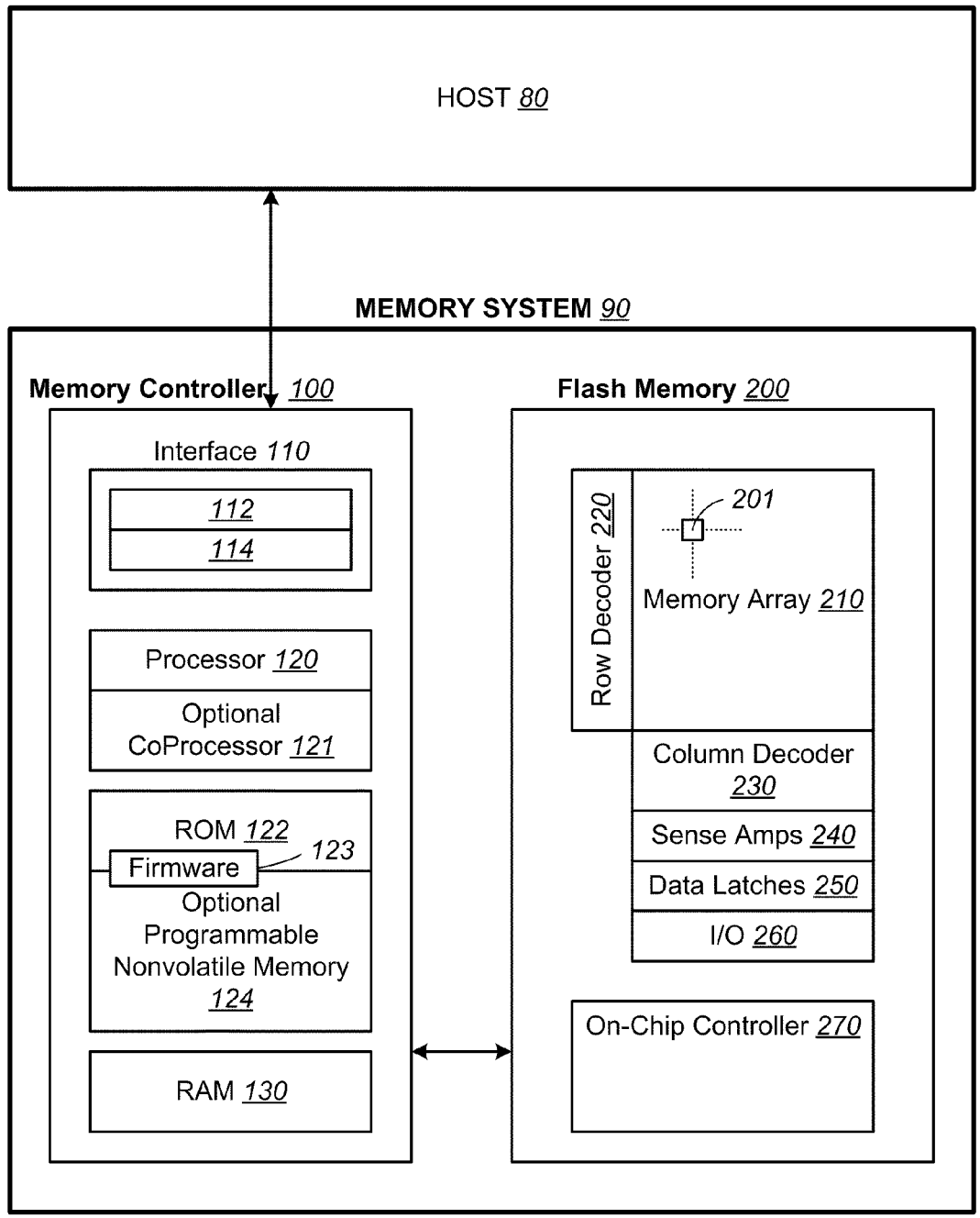
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 cooperating with a memory controller 100. The memory 200 comprises of one or more array 210 of non-volatile memory cells distributed over one or more integrated circuit chip. Each memory array 210 has the memory cells 201 arranged in rows and columns accessible by word lines and bit lines via a row decoder 220 and a column decoder 230 respectively. A group of sense amplifiers 240 allows a corresponding group of memory cells to be sensed via their bit lines in parallel. A corresponding group of data latches 250 cooperate with the group of sense amplifiers 240 to temporarily store data read from the memory or stage data to be written to the memory. In parallel operation, a page of data is latches at a time. An I/O circuit typically allows serial data to be shifted into or shifted out from the group of data latches 250.

An on-chip controller 270, typically embodying a state machine, serves to control basic operations of the memory array and the peripheral circuits. Basic programming and reading and erase operations are controlled by the state machine.

The memory controller 100 includes an interface 110, a processor 120, an optional coprocessor 121, ROM 122 (read-only-memory), RAM 130 (random access memory) and optionally programmable nonvolatile memory 124. The interface 110 has one component 112 interfacing the controller to a host and another component 114 interfacing to the memory 200. Firmware 123 is stored in the memory provided by ROM 122 and optionally programmable nonvolatile memory 124. The firmware provides codes for the processor 120 to implement the functions of the controller 100. Also, the various features of the invention are preferably implemented in the firmware 123, or in combination with the state machine of the on-chip controller 270. Error correction codes may be processed by the processor 120 or the optional coprocessor 121 acting as ECC encoder and decoder. In an alternative embodiment, a simpler embodiment of the controller 100 is implemented within the host.

Example of MLC Memory

FIGS. 2(A)-2(D) illustrate an example MLC memory that is capable of storing two bits per cell. A memory cell in the memory can be programmed to any one of a range of threshold voltages in a threshold voltage window that spans from $V_{MIN}$ to $V_{MAX}$. The threshold voltage of a cell increases with increasing programming. In this 2-bit example, the threshold window is partitioned into four voltage bands by three reference or demarcation voltages $V_1$, $V_2$ and $V_3$. The four bands are from $V_{MIN}$ to $V_1$, from $V_1$ to $V_2$, from $V_2$ to $V_3$, and from $V_3$ to $V_{MAX}$.

FIG. 2(A) illustrates schematically a histogram of cell voltage distribution (CVD), which is a distribution of read threshold voltages for a collection of flash cells. The read threshold voltages of the cells are distributed statistically around the centers of their respective voltage bands.

When data is actually stored (programmed) in the memory according to such a partition scheme, the three demarcation voltages $V_1$, $V_2$ and $V_3$ are the so-called "hard" reference thresholds or "integral" reference thresholds. These reference thresholds partition the threshold windows into four voltage bands which are coded by two hard bits: "upper bit, lower bit" or "HB2, HB1".

For historical reasons, writing data to a flash cell is called "programming" the flash cell. This is done by applying voltage pulses to the cell, to inject electrons from the cell's silicon substrate through the cell's oxide layer into the cell's floating gate, until the threshold voltage of the cell is higher than a "verify" voltage level associated with representation of the desired bit pattern. (The verify voltage level is called a "verify" voltage level because programming the cell includes verifying that the cell's threshold voltage exceeds this level. In many implementations, the verify voltage level is at a positive offset from an integral reference threshold in order to place the read threshold voltage at lower voltage compared with the programmed verify voltage so as to make room for cells relaxation phenomena such that after programming cell's read threshold voltage is decreased.

A threshold voltage between $V_{MIN}$ and $V_1$ is considered the "erased" or "E" state and is represented by the bit pattern "11". A threshold voltage between $V_1$ and $V_2$ is considered a first programmed state "A" and is represented by the bit pattern "01". A threshold voltage between $V_2$ and $V_3$ is considered a second programmed state "B" and is represented by the bit pattern "00". A threshold voltage between $V_3$ and $V_{MAX}$ is considered a third programmed state "C" and is represented by the bit pattern "10". In general, the voltage window of an m-bit-per-cell memory is divided into $2^m$ voltage bands by $2^m-1$ demarcations. Other coding schemes are also possible. For example in the m=2 example of a 2-bit memory with threshold voltage distributions as in FIG. 2(A), another scheme can be derived if the bit pattern "01" and "10" interchanged.

In MLC memories where each memory cells stores m bits of data and a group of memory cells are read in parallel with p sense amplifiers. Reading a cell is to determine the programmed threshold of the cell relative to which of the $2^m-1$ voltage bands. There are two ways of reading the group of memory cells.

A first way is a "full-sequence read". By comparing up to all $2^m-1$ reference voltages in the threshold window the voltage band containing a cell's threshold is determined. Once the band containing the programmed threshold of a cell is located, and given a bit coding scheme, all m bits for the cell can be obtained.

FIG. 2(B) illustrates a full-sequence read of the 2-bit memory with threshold voltage distributions as in FIG. 2(A). The programmed threshold of a cell being read is compared to up to all the read voltage levels, $V_1$, $V_2$ and $V_3$ in order to locate which voltage band it is in. When a group of memory cells are read in parallel, two logical pages are obtained. A lower logical page will be constituted from the HB1 of each cell of the page, and an upper logical page will be constituted from the HB2 of each cell of the page.

In general for an m-bit memory, when a group of cells are read in parallel, m binary pages are obtained in a full-sequence read operation. However, a full-sequence read places demand on data latches, as they must have sufficient capacity to buffer all m bits.

A second way is a "progressive" read. Often it is preferably to have a programming and coding scheme in which the flash memory is programmed with one bit of the bit pattern at a time. For example, a lower page of HB1 is first programmed. This is followed later with an upper page of HB2.

To read back, the bit pattern is to be read by a "progressive bit read" method. The bit pattern is read bit-by-bit over multiple read passes, with each pass comparing to only some of the $2^m-1$ reference voltages. Reading a cell that stores a bit pattern of m bits requires m such passes. At each read pass, one bit is read from each of the cells of the group.

Essentially, the read thresholds in the form of the reference thresholds are arranged as a hierarchical binary tree, partitioning the threshold window in multiple stages of interval chopping. At each read pass, the programmed threshold of the cell is determined relative to a subset of the read thresholds for one stage of the hierarchical binary tree. At each read pass, only one of the m bits of each cell of the group is read out. In m read passes, all m stages of the hierarchical binary tree are visited and all m bits of each cell of the group are read out. Thus, the m binary pages are read out page-by-page. This is preferably since the data latches only need to store one bit instead of m bits. The page-by-page mode is also preferably from a programming point of view since as soon as a page's worth of data has been received by the memory from a host, it can be written immediately to the memory. Note however that in order to program just one page at a time for some 'm' bits per cell storage a corresponding mapping has to be designed in order to allow such operation. Obviously not all mapping schemes allow such page by page programming method.

FIG. 2(C) illustrates a first read pass of the 2-bit memory with threshold voltage distributions as in FIG. 2(A) in which the lower logical page with HB1 is read. Essentially, the reference threshold $V_2$ serves to partition the threshold window in two half bands. Each cell's programmed threshold voltage is compared to $V_2$. If it falls in a band to its left, then HB1=1, and HB1=0 if in the band to its right.

FIG. 2(D) illustrates a second read pass of the 2-bit memory with threshold voltage distributions as in FIG. 2(A) in which the upper logical page with HB2 is read. Essentially, each of the two half bands in the first pass is further partitioned into two other bands. Depending on the value of HB1, each cell's programmed threshold voltage is compared to either $V_1$ or $V_3$. If HB1=1, and if the programmed threshold is less than $V_1$, then HB2=1; otherwise, HB2=0. On the other hand, if HB1=0, and if the programmed threshold is less than $V_3$, then HB2=0; otherwise HB2=1. Another option for progressive read in this case is to ignore the first read at $V_2$ when HB2 is read. With this method, each cell is read directly at $V_1$ and $V_3$. If the cells read threshold is placed below $V_1$ then HB2=1, if it is below $V_3$ but above $V_1$ then HB2=0, if the read threshold is above $V_3$ then HB2=1 as well. The advantage of the second method is that a latch holding HB1 is not required when HB2 is read, and furthermore it is not required at all to sense the array at $V_2$ in order to read HB2.

Considerations for Non-Integral Reference Thresholds and Soft Bits

As described earlier, the memory is programmed with respect to integral reference thresholds which demarcate the various voltage bands that partition the threshold window. If the memory is configured to have memory cells each storing m bits of data, the threshold window is partitioned into $2^x$ bands demarcated by $2^x-1$ integral reference voltages. In principle, the x bits (hard bits) can be determined if the programmed threshold is compared to the $2^x-1$ integral reference thresholds.

Previous scheme has described the case when the number of read sensing is not necessarily in the form of $2^x-1$ while the placement of the read levels is performed in a non uniform manner.

Figure 2:
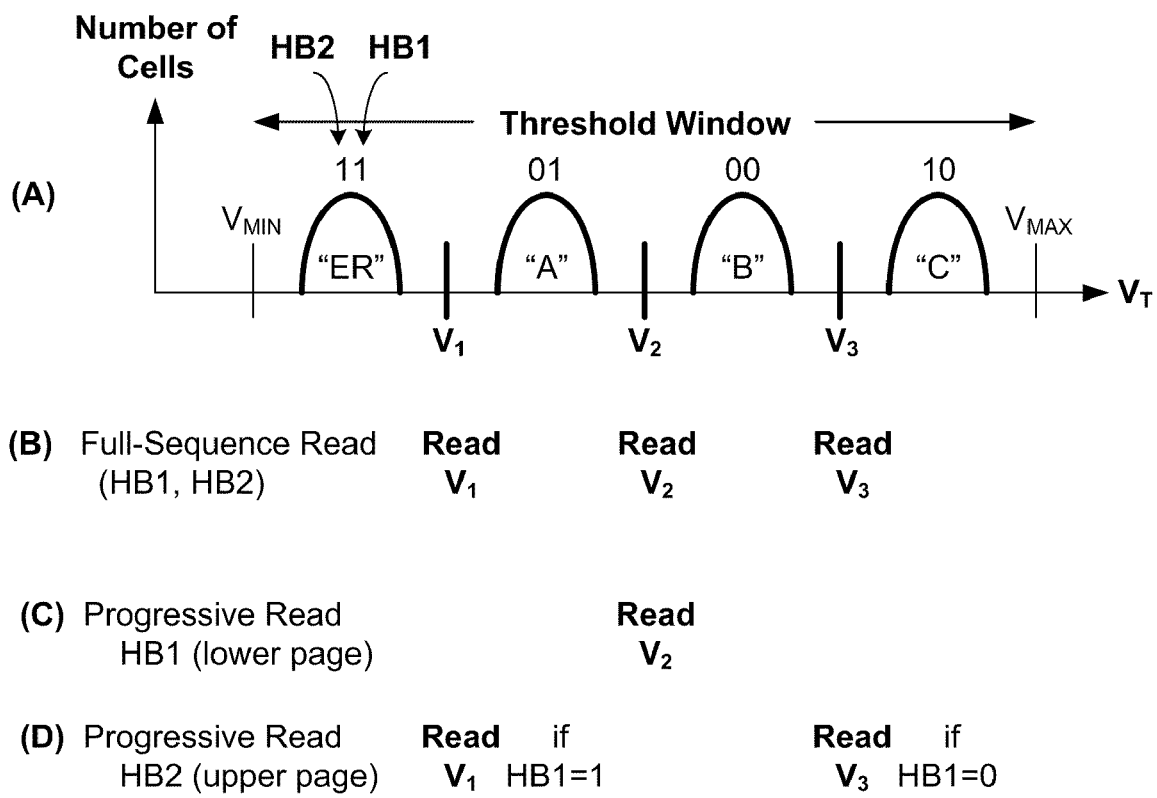
FIGS. 2(A)-2(D) illustrate threshold voltage distributions of an example MLC memory that is capable of storing two bits per cell.
Figure 3:
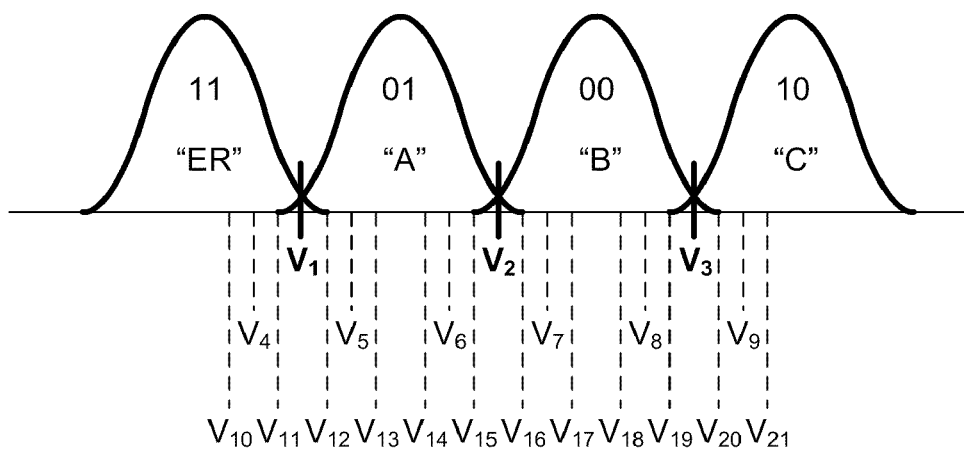
FIG. 3 illustrates the use of non-integral reference voltages in addition to the integral reference voltages for the 2-bit memory with threshold voltage distributions as in FIG. 2(A).

FIG. 3 illustrates the use of non-integral reference voltages in addition to the integral reference voltages for the 2-bit memory with threshold voltage distributions as in FIG. 2(A). For example in FIG. 2(A), for x=2, three uniformly placed read levels $V_1$, $V_2$ and $V_3$ across the threshold window are sufficient to yield the two HBs on an MLC type flash device. In FIG. 3, In addition to the 3 integral reference voltages $V_1$-$V_3$ used as read thresholds, there are 18 non-integral reference voltages for read thresholds $V_4$-$V_{21}$ contributing to a total set of 21 read thresholds ($V_1$-$V_{21}$).

While the 3 integral reference voltages yield 2 hard bits (HB), the additional 19 non-integral read thresholds are not located on the voltage window uniformly and yield at least two soft bits ("SB"). More particularly the threshold voltages are concentrated around the overlap regions of the CVD (cell voltage distribution) representing adjacent states. It can be shown that by applying this concentration, the capacity metric of the flash channel is maximized and hence the reliability measures read from the flash device improves the error correction capability of a soft input decoder able to takes advantage of these reliability measures. In a straightforward manner when we have 21 demarcation points and thus 22 voltage bands it would require in total 5 bits to represent them, therefore assuming out of these 5 bits 2 provide the hard information (HB1 and HB2) we are left with 3 soft bits such that together they all represent the corresponding voltage band. It will be shown later on that with the new method this application is presenting only two more bits can be extracted instead of 3. The advantage is that less information is transferred from the flash memory (200) to memory controller (100) thus speeding up the read operation.

The scenario when read thresholds $V_4$-$V_{21}$ are not aligned uniformly within the cell's voltage window is denoted as non-uniform SB read. Upon using non-uniform readings of SB (Soft Bits) for each number of read points (Vth) the actual read thresholds can be optimized independently.

The present schemes suggest specific optimized ways in which specific sets of read thresholds are configured and are read from a flash device.

Memory Employing a Set of Read Thresholds in which Hard Bits are not Nested within Soft Bits According to a first aspect of the invention, in a memory having a threshold window and is programmable with respect to a first set of reference thresholds for partitioning the threshold window into a first set of threshold voltage bands, a scheme of reading the memory includes providing a second set of reference thresholds that are distributed non-uniformly across the threshold window for partitioning the threshold window into a second set of threshold voltage bands, so that a region of the threshold window where a higher number of errors occurs has a higher density of reference thresholds, and the first set of reference thresholds is not a subset of the second set of reference thresholds. The scheme of reading the memory further includes determining the programmed threshold of the memory relative to one of the second set of threshold voltage bands.

This scheme amounts to the hard bits logically associated with defining the partitioning of the threshold window during programming are not nested within the soft bits associated with a more refined and non-uniform partitioning of the threshold window during reading. The first set of reference thresholds defining a first partition of the threshold window during programming is not a subset of a second set of reference thresholds defining a second partition of threshold window during reading. The second set may include none or only some of the reference thresholds of the first set.

To this end the scheme proposes a specific manner for setting the read thresholds in order to include a number of features. A first feature is non-uniform SB (soft bit) read. This allow for at least two different regions of Cell Error Rate (CER) among the threshold window. In each region a different resolution of the Soft Bits (SB) is required, e.g. the number of read sensing required in order to successfully decode bits stored in cells attributed to word lines (WL's) in the high CER region is larger than the number of read sensing required in order to successfully decode bits stored in cells attributed to WL's in the lower CER region.

This manifests as a higher concentration of reference thresholds in the higher CER region. For example in FIG. 3, the read thresholds ($V_4$-$V_{21}$) are not aligned uniformly within the cell's voltage window. They are clustered around each transition between bands where the CER is higher.

Thus, upon using non-uniform readings of SB (Soft Bits) for each number of read points (Vth) the actual read thresholds can be optimized independently.

For example in a normal read of an MLC device (2 bits per cell) such as that illustrated in FIG. 2(A), a set of 3 optimal thresholds $V_1$, $V_2$, $V_3$ are selected accordingly. These 3 threshold voltages distinguish between 4 states and thus help to decide upon which state was programmed in each cell. Once a correct distinction is made the two bits represented by the programmed state is correctly reconstructed and these two bits are referred to as hard bits (HB). In case the wrong state is chosen due to reasons given earlier, then an erroneous set of two bits is reconstructed, resulting with errors in the read operating.

Commonly an ECC decoder is applied to the stream of read bits set to correct such errors. An ECC decoder includes an ECC transformation layer which computes an LLR (Log-Likelihood Ratio) for each HB from its corresponding HB+SB information read from the cell in which the HB is stored, then these LLR's are processed by an ECC core decoder to decode the HB's. In order to reduce the number of redundancy bits/cells employed by said ECC it is desired to minimize the number of erroneous bits/cells the decoder is designed to handle and to provide the ECC decoder with optimal reading thresholds such that it's correction capability is maximized given a finite redundancy bits/cells allocated in the flash for it's operation.

One such well known metric for maximizing the capacity of the flash device is the mutual information I(X;Y) between the programmed state (X) and read threshold voltages (Y). A common manner to measure and compute the mutual information is by measuring the CVD for each state separately (a.k.a. state by state CVD) and then computing the state transition matrix P(Y|X) such that X denotes the vector of programmed states and $\underline{Y}$ denotes the vector of read voltage regions represented by a set of bits. Using P($\underline{Y}$|$\underline{X}$) the mutual information is given by Equation (1.1):

$$I(\underline{X};\underline{Y})=D[P(X,Y),P(X)\cdot P(Y)] \quad (1.1)$$

Here D(z) is the Kullback-Leibler distance, as detailed in C. E. Shannon, "A mathematical theory of communications", Bell Syst. Tech. J., vol. 2, pp. 379-423,623-656, 1948.

In the above example when only hard bits (HB) are read from the flash then 3 sense operations are performed and 2 bits are received by the controller. It turns out that Equation (1.1) is close to it's maximized value when the 3 read thresholds in the above example are selected such that the BER/CER is minimized, e.g. thresholds $V_1$ is placed between states 'ER' and 'A' to minimize the CER i.e. minimize the number of cell programmed to 'ER' state and read as 'A' state plus the number of cells programmed to state 'A' and read as 'ER' state. In a similar manner $V_2$ is placed between states 'A' and 'B' while $V_3$ is placed between states 'B' and 'C'.

Progressive Read and Nested Bits

One useful property of such a scheme is that the sensing operation can be done in stages. This property is expedient when the CER exhibited by the flash cells is not known to the decoder at decoding time in such extent that even the region (low/mid/high) is not known. Therefore, in order to avoid unnecessary read sensing and transfer of information from the flash device to the controller, the decision what sensing operations and which data is to be sent to the controller is done in stages with intermediate feedback from the ECC. This strategy was already disclosed in "Error Correction decoding by trial and error", Simon Litsyn, Eran S. & Idan A.

Figure 4:
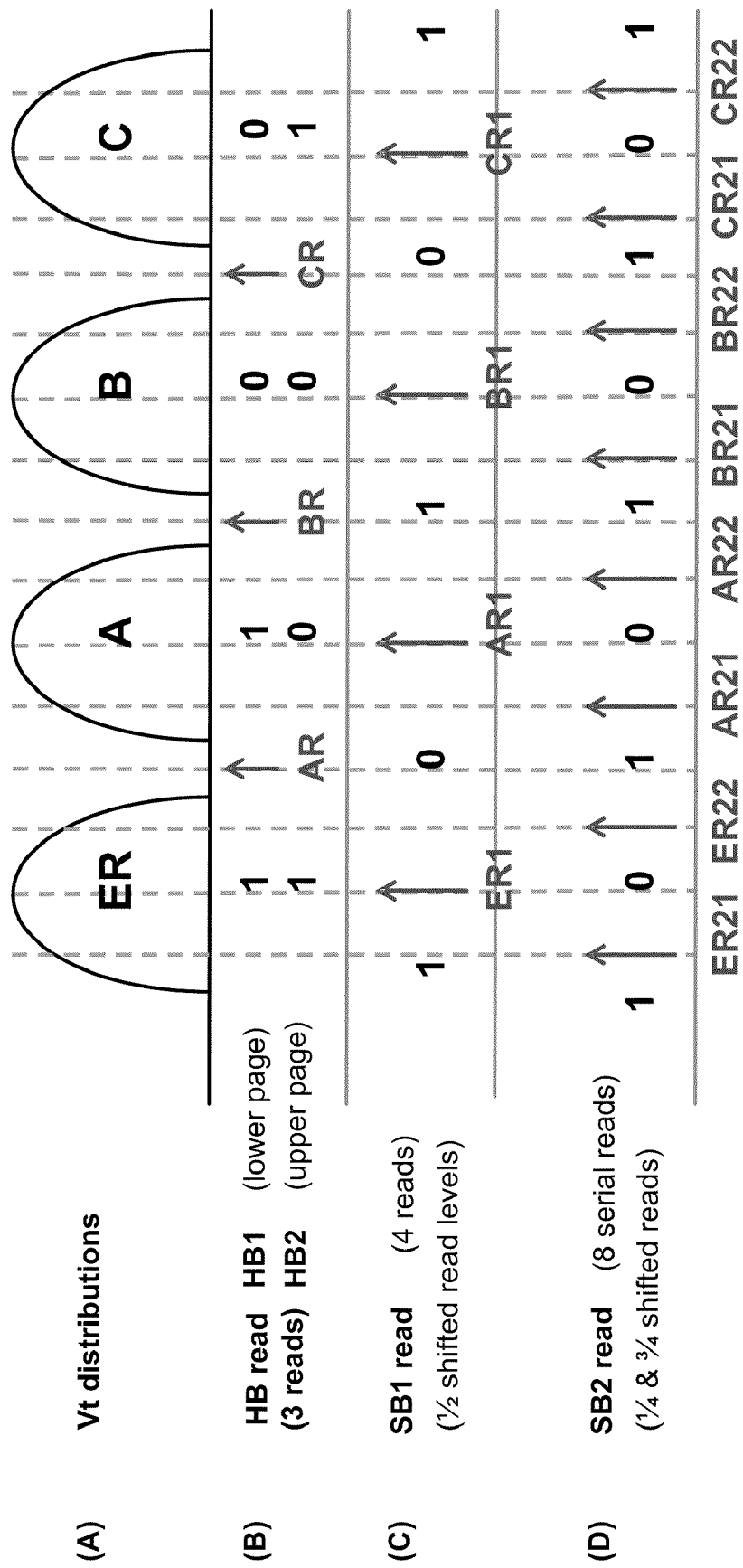
FIGS. 4(A)-4(D) illustrate an example of reading the 2-bit MLC memory with threshold voltage distributions as in FIG. 2(A) using 15 read points in a "nested SB read scheme".

FIGS. 4(A)-4(D) illustrate an example of reading the 2-bit MLC memory with threshold voltage distributions as in FIG. 2(A) using 15 read points in a "nested SB read scheme". FIG. 4(A) illustrates the 2-bit distribution of programmed thresholds for a population of memory cells similar to FIG. 2(A). Keeping the distance between two consecutive read points a constant is denoted by uniform SB reading. The 15 read points provide a total of 16 voltage regions that can be represented by 4 bits. The 15 read points are performed in 3 sense cycles.

FIG. 4(B) illustrates the first sense cycle which employs read points AR, BR and CR (corresponding to the integral reference points $V_1, V_2$ and $V_3$ in FIG. 2(A)) to yield hard bits, HB1 and HB2.

FIG. 4(C) illustrates the second sense cycle which employs read points ER1, AR1, BR1 and CR1 to yield soft bit, SB1.

FIG. 4(D) illustrates the third sense cycle which employs read points ER21, ER22, AR21, AR22, BR21, BR22, CR21 and CR22 to yield soft bit, SB2.

Thus, initially only 3 sense points are performed to get the 2 HB (denoted as AR, BR and CR). As described in connection with FIG. 2(C) and FIG. 2(D), preferably, these 2 HB are obtained in two progressive read passes and transferred to the memory controller after each bit is read. These 2 bits (from each cell) are then fed to an ECC decoder in the memory controller to start decoding. In the case of the decoding indicating occurrence of errors (i.e., the decoder fails or terminates in a pre-set time frame without convergence) then the next soft bit, SB1 is obtained. This is accomplished by the second read pass with the 4 read points ER1, AR1, BR1, and CR1. Then the ECC can be activated with the original two HB+the extra SB1.

In a similar manner if the decoding fails or terminates W/O convergence then the next soft bit, SB2 is obtained. This is accomplished by the third read pass with another 8 read points ER12, ER22, AR12, AR22, BR12, BR22, CR12, CR22. The ECC decoder is now activated again with the previous HB+SB1 and the new extra SB2.

Such a scheme is denoted a "nested SB read scheme", meaning that any HB and SB read are progressive and nested in the set of HB+SB employed when more HB or SB are read later on. Note that even within the HB this scheme is nested. As noted earlier, this scheme is desirable because sensing operations can be parsed to the bit-by-bit level, thereby allowing the use of less data latches and more optimal pipelining operations.

However, the present invention observes that when SB are required over HB (in order to allow the decoder to cope with higher CER) and at the same time the read points or thresholds (Vth) are optimized to maximize Equation (1.1) then in some cases the nesting property can no longer be maintained. These cases depend on the number of sensing thresholds required in order to extract with enough information to an ECC decoder to succeed.

Figure 5:
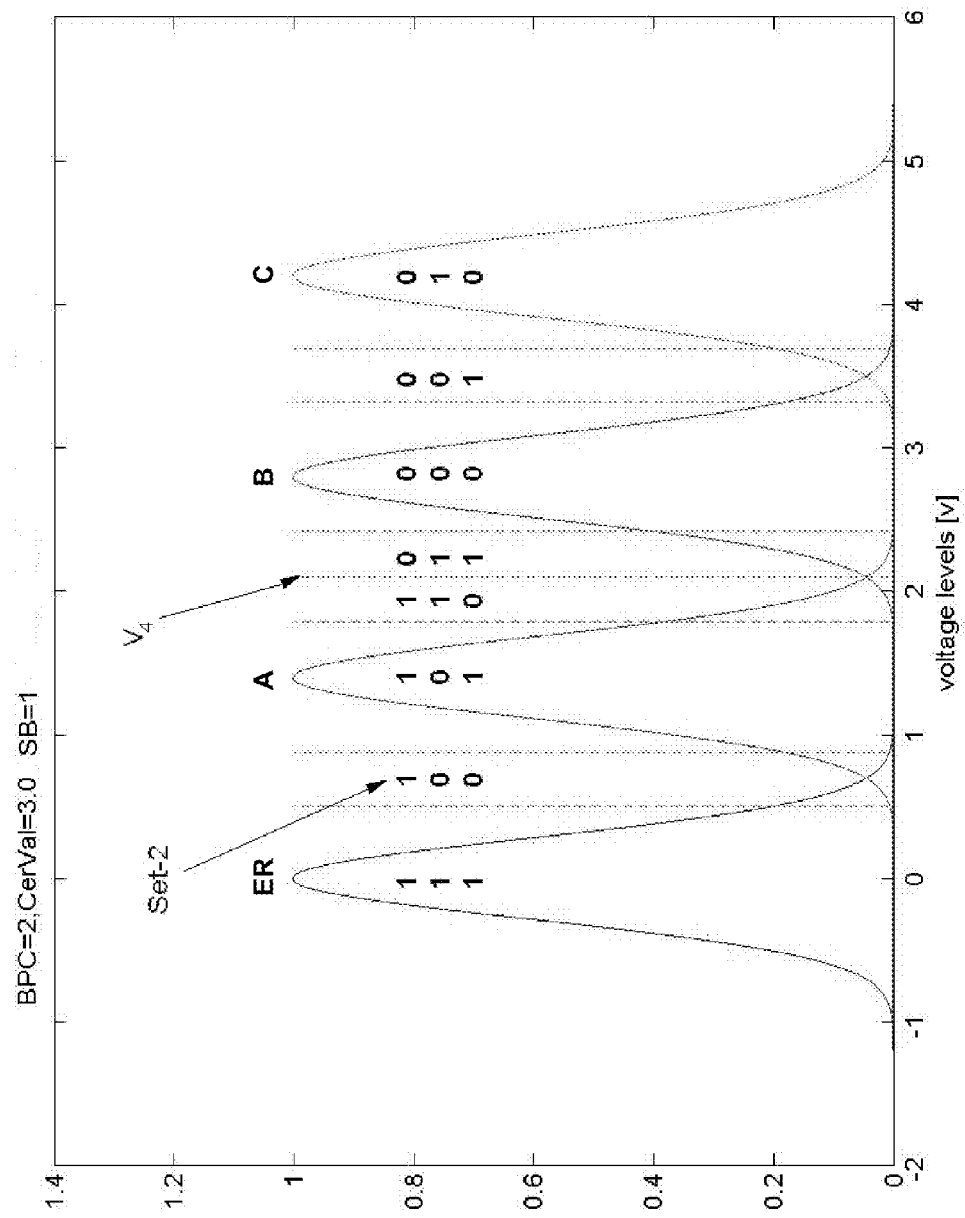
FIG. 5 illustrates an example of using 7 read points optimized for a Gaussian model for the CVD of all 4 states in which the CER=3%.

FIG. 5 illustrates an example of using 7 read points optimized for a Gaussian model for the CVD of all 4 states in which the CER=3%. The 7 read points partition the threshold window into 8 non uniform voltage bands which can be coded by 3 bits. It can be observed that when exporting 3 bits in this scheme the HB are no longer nested in these 3 bits provided for each region.

Assuming for example that for a specific cell, the 3 bits coming out from the circuit of this design scheme is '100' ('top, middle, bottom', see Set-2 in FIG. 5). It is not clear if the upper page bit is 0 or 1 for the 2-bit cell (see HB1 and HB2 in FIG. 4.). The upper page of FIG. 4 corresponds in some way to the middle bit of FIG. 5. The read scheme returns '0', however in terms of what state was programmed the probability for state 'ER' and state 'A' are the same.

Also in FIG. 5, except for read point $V_4$ coinciding with BR, none of the other 6 read points overlap with AR or CR shown in FIG. 4(B). This means that the integral read points corresponding to hard bits do not necessary coincide with any of the read points in a non-nested read scheme.

In one embodiment, the memory system has a background process that keeps track of the reliability of blocks in the device. One example is tracking the reliability of a block by its hot count, which is a measure of the amount of wear the block has suffered through a counted number of erase cycling. The hot count provides a measure of CER for the block. In flash devices which include such a process the reliability of blocks is considered to be known at time of read. Such a process may categorize the reliability of blocks into a few groups of different CER. In reading a block, the required correction capability is know a priori and this translated to the required number of SB for reading. The result is that the amount of error correction is known at least to some extent at the time of read. This knowledge allows the controller to select the appropriate SB scheme.

In another embodiment in which the cell reliability is known even if such background process dos not exist is when a sequential read is performed and on the 1st WL a trial and error scheme is activated while for all other WL's in the same block the decision acquired from the trial and error process on the 1st WL is employed. In this particular case, for subsequent WL's (after the 1st read WL) the controller knows what is the required number of SB to use.

Thus, when the amount of required SB is known at time of read then there is no longer a need for a nested SB scheme. The use of non-nested SB (or different sets of read sensing according to the flash reliability) allow for the case of non-uniform SB readings which maximize error correction performance.

With non-uniform SB read, and for each CER scenario an appropriate set of read points or thresholds is applied. Thus, there is no longer confinement to some specific number of sensing operations according to the amount of SB read. For example for the 2-bit cell, for SB1 any number of read points between 5 and 7 can be chosen according to the CER in the device. Evidently, as the number of read sensing operation increases so does the correction capability of the decoder, assuming that for each such number of read sense operations a separate optimization is performed for their locations.

Again, for the 2-bit cell, and the case of two SB any number of read thresholds between 8 and 15 can be chosen. In this way, as the accuracy of the CER estimation increases, also the accuracy of the estimation of the amount of required sensing operations increases and thus the appropriate read scheme to be used can be estimated more accurately. The advantage is that read speed and consumed energy is better adapted according to the condition of the data being read along the life time of the flash device.

More specifically for the case of 1 soft bit any number of read thresholds from 4 (defining 5 voltage regions) up to 7 read points (representing 8 voltage regions) can be employed. Denote for example these thresholds as such $V_1, V_2, \ldots, V_j$ that $3 \leq j \leq 8$. When optimizing these thresholds to maximize the cell capacity (alternatively maximize correction capability) it may very well be the case (as seen in FIG. 5) that there is at least one $V_k$ such that $k \in \{1, 2, \ldots, j\}$ for any value of j for which $V_k \neq Vth_1$, $V_k \neq Vth_2$ and $V_k \neq Vth_3$. Here $Vth_1$, $Vth_2$ and $Vth_3$ represent the optimal read thresholds to obtain just the hard bits information. Define this case as 'non nested thresholds'. Now when SB-1 is computed then the total number of reads is at least 'j-2' (for the case of 2-bit memory) and usually it is 'j', i.e., all read sense operations have to be repeated when the SB is obtained. The case of nested thresholds (depicted in FIG. 4) for j=7, after the first 3 read operations generating two HB (hard bits) only 4 additional reads are required in order to generate the extra SB1. So using the lower limit for j=7 after counting 3 sense locations we need in total at least 5 so the minimum is 2 (7–2–3) but in the example case of FIG. 4(C) we use 4.

In the non-nested case a new set of 3 bits are generated from the new 7 reads (or 'j' reads in general) in which there is no longer a clear distinction between HB and SB for all values of the 3 bit vector. Each set of 3 bits defines a voltage band which is in turn converted to a set of reliability measures fed into a soft input ECC decoder (the 3 bits representing each cell in the example) that is set to decode the original information stored in the flash device.

Figure 6:
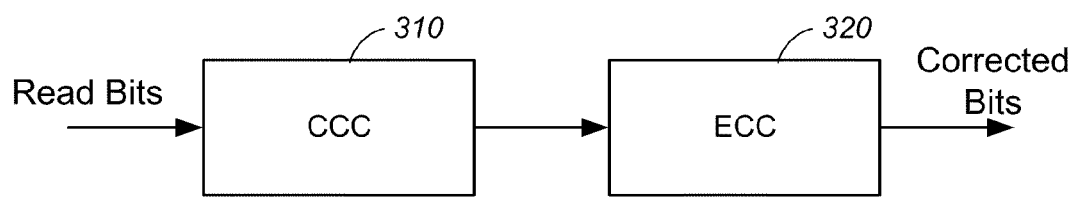
FIG. 6 illustrates another embodiment in which the read bits are fed into a Cross Coupling Canceller prior to feeding to an ECC for further processing.

FIG. 6 illustrates another embodiment in which the read bits are fed into a Cross Coupling Canceller prior to feeding it to an ECC for further processing. For example, 3 bits (in 2-bit MLC and SB1) are fed into a CCC (Cross Coupling Canceller) 310. The output of the CCC is then fed to an ECC decoder 320 for further processing to obtain the corrected programmed bits. CCC is described in "Post-facto correction for cross coupling in a flash memory", U.S. Pat. No. 7,551,237, the entire disclosure of which is incorporated herein by reference.

Non-Volatile Memory and Methods with Asymmetric Soft Read Points Around Hard Read Points According to another aspect of the invention, a memory having a threshold window is read relative to L−1 read points (reference thresholds), where "L" is the total number of different states programmed to the device and is related to the number of bits 'x' programmed to each cell by $2^x \geq L$ (e.g., L=4 for a 2 bits per cell, L=8 for a 3 bits per cell device). A set of read thresholds associated with hard bits 'x' and soft bits 'y' is defined across the threshold window is associated with a set of reference thresholds L+M−1 such that $2^{(x+y)} \geq L+M$. The set of reference thresholds L+M−1 is arranged into similar subsets of read thresholds that are related to each other subset by an integral offset.

The set of read reference thresholds associated with the bits (HB+SB) or 'x+y' bits gives rise in general to a total of 'L+M−1' sensing operations. There no longer exists a clear separation between hard and soft bits. The set of reference thresholds are designed for grouping into similar subsets, so that a read cycle of reading relative to a subset yields one bit of the x+y bits. This manifests as the reference thresholds in the set associated with soft bits not symmetrically located around that of the hard bits.

In a preferred embodiment the distance between the different read point thresholds (Vth) within the set of L−1 reference thresholds is preferably kept the same for each set of L−1 sense cycles while the shift or offset of the thresholds between different sense cycles is an integer multiplication of a basic unit shift defined as ΔR.

In other embodiments, the distance between each subsequent read threshold level within a sense cycle does not have to be the same.

The advantage is that the 'x+y' bits can be obtained bit-by-bit in each read cycle, thereby using one latch per cell. Furthermore, each read cycle of a subset conforms to a similar format and algorithm, thereby allowing the use of a simple, standardized read circuit. The method for implementing the generation of the set of read thresholds associated with the hard and soft bits (HB+SB) or 'x+y' bits respectively that correspond in general to a total of L+M−1 sensing operations where $2^x = L$ and $2^{x+y} = L+M$.

The challenge is to maintain simplicity of design and minimum number of data latches. Thus, a specific family of circuit design methods is disclosed to handle different number of required read sensing operations. This circuit is highly efficient and simple to implement requiring minimal number of latches.

As mentioned earlier in connection with FIG. 1, a latch in the flash is a memory element allocated for each sense amplifier. Thus when there are for example 100,000 sense amplifiers, one latch is equivalent to 100,000 memory elements. Since these latches exists inside the flash memory device, required for it's operation (reading and writing data to the flash), it is desired to keep the number of latches at a minimum in order to reduce the impact on memory chip size.

The main advantage of using a latch is that in a short period of time an operation can be defined on the entire latch in parallel. Alternatively, the parallelism factor in processing all cells on one WL (word line) is maximized. With the above example, 100,000 memory elements are locking a value in parallel.

The basic idea is to provide the bits of one page at the same time, thus taking full employment of the available latches. Once a bit in the vector of 'x' (bits per cell) is known for all the cells on the same WL, the data (of all cells on the WL) stored in the latch is sent to the controller and frees up the latch.

FIGS. 7(A)-7(E) illustrate a first embodiment the read levels and threshold voltage distributions of for a 2-bit memory where the read levels of the soft bits are not symmetrically located relative to the hard bits. It will be seen that the operations to obtain the 4 bits (2HB+2SB) involves 4 repeated operations of reading 3 read points plus inverted XOR.

FIG. 7(A) illustrates the 2-bit distribution of programmed thresholds for a population of memory cells similar to FIG. 4(A). It will be seen that the reference thresholds for the HB do not coincide with that of FIG. 4(A). In this case there are two quasi HB with 3 read points and two non-uniforms SB reading, one with 3 read points and the other with 2 sets of 3 read points. In this example, only one latch is sufficient. This characteristic is achieved when the read circuit supports the inverted XOR operation to be done on the latch plus the sensed data while the result is in placed to the same latch.

FIG. 7(B) illustrate that the first 3 reads are performed (with read points AR',BR',CR') to determine the first two quasi hard bits. These first two bits are actually quasi HB since they are not located at the same levels as AR, BR and CR shown in FIG. 4(A).

The first quasi bit (denoted as HB1) is provided by a first read at BR'. If the cell is conducting then the bit is set to '1' (the threshold voltage of the cell is lower than BR') otherwise the bit is set to '0' (the threshold voltage of the cell is higher than BR'). This sensed bit is stored in a latch. Then the contents of the latch holding this bit for all the cells in the WL is sent to the controller in order to free up the latch.

The second quasi bit (denoted as HB2) is provided by a second read and is performed at either read point AR' or read point CR' depending on the value of HB1 (see FIG. 2(2.2)). For example, HB1=1 means the cell's threshold is located at the left half of the threshold windows and therefore further resolution of it will be in relation to AR'. Similarly, if HB1=0, the CR' will be relevant. Since a group of memory cells is read in parallel, some cells will likely has a HB1 value that require reading at AR' while others require reading at CR'. From an operational point of view, both AR' and CR' will have to be visited. Thus, one may as well perform a second read on the entire group of cells relative to the read point AR' followed by a third read relative the read point CR'. A set of logic operations on the results from the second and third reads is then employed to parse out reading relative to respectively AR'/CR' for those cells whose threshold is on the left/right half of the threshold window.

Another way to ready the second quasi bit independently from the first quasi bit is by reading AR' then reading at CR' while NXOR these two outcomes. This is accomplished by the set logic operations where the result from the read at CR' is negated (or inverted) and then XOR'ed with the result from the read at AR'. Note it is sufficient to use only one latch in order to implement such operation since the output of the CR' sense operation can be negated and XOR'ed with the single latch holding the result of the sense operation at AR' while the result for the XOR operation is in placed in the same latch. Since the NXOR operation is exchangeable to it's inputs alternatively the result from the CR' sense an be XOR'ed with the inverted data placed in the latch holding the sense at AR' e.g. NOT(AR') XOR CR'=AR' XOR NOT(CR')=NOT (AR' XOR CR').

For example, for the read point at AR', if the cell's threshold voltage is less than AR', the cell is conducting then the bit is set to '1', otherwise it is higher than AR' and the bit is set to '0'. This bit from sensing with AR' is temporarily stored in the latch while a third read at read point CR' is taking place. Again if the cell's threshold is less than CR', the cell is conducting then the bit is set to '1', otherwise the bit is set to '0' (the threshold voltage of the cell is higher than CR'). This time however the bit from sensing with CR' is not transferred directly to the latch but instead it is negated and then XOR'ed with the bit from AR' already stored in the latch. After the XOR operation, the result is stored in the same latch for each cell, overwriting the bit for AR'. This result represents HB2 or actually quasi HB2.

This last 'in-flash' processing of the bit from the array to the latch operation is denoted as NOT/XOR (or inverted XOR as it is depicted in FIG. 7(E)). Essentially, the bit for those cells which have a charge lower than CR' threshold voltage will be '1' and after the negation, it will be '0'. Thus it doesn't change the '0''s already appearing in the latch (for that group of cells) when the in place XOR is performed as 0 XOR 0=0 For cells with threshold voltage higher than CR' the negation operation flips the bit received from the flash array from '0' to '1' and hence for all cells for which the threshold voltage is above CR' the '1' obtained after negation is XOR'ed with the '0' already placed in the latch to provide with the correct quasi upper page bit (or HB2).

Thus, for the group of cells being read in parallel, HB1 from each of the cells will form the "quasi lower page", and HB2 will form the "quasi upper page". Similarly, as will be described below, SB1 will form a quasi SB1 page and SB2 will form a quasi SB2 page. Optimization of the read points are made on a given number of bits as a whole. In this example, only after providing all 4 bits to the controller the controller can use them. A subset of these 4 bits do not provide the optimal sampling in terms of the sub-set and only as a group they provide the necessary reliability for the data read from the 2-bit memory.

FIG. 7(C) illustrates the read to obtain the first soft bit, SB1. This step is to provide the quasi SB1. Here another set of L−1 read sensing is done where the read points are 2ΔR shifted from AR', BR' and CR'. Thus, the first read threshold is located on AR'+2ΔR such that subsequent readings are performed at BR'+2ΔR and CR'+2ΔR respectively. With these 3 read operations the same procedure is repeated as done with the quasi upper page (or HB2), this time with 3 sense operations rather than two. This means the latch is first stored with a bit resulted from sensing at AR'+2ΔR. Then after the BR'+2ΔR sensing the received bit from the sense amplifier is 'in place' NOT/XORed with the bit from AR' in the latch. Then again after the CR'+2ΔR sense operation, the received bit from the sense amplifier is 'in place' NOT/ XORed with the bit already placed in the latch. In this manner, again, only one latch is required to store the quasi SB1.

Note that before the last sense operation, cells with threshold voltage in between BR'+2ΔR and CR'+2ΔR holds the value '1'. The bit received from the flash array for cells in this region is '1', and after negation, it is set to '0' and hence the XOR doesn't change this bit for that group of cells. For cells with threshold voltage above CR'+2ΔR after the second sense operation the latch holds '1' also. However in the last sense operation (at CR'+2ΔR) the bit received from the flash array turns to '0' after negation it is '1' and the XOR operation transforms the '1' in the latch to '0' (1 XOR 1=0).

FIG. 7(C) illustrates the quasi SB1's coding across various voltage bands of the threshold window. Once quasi SB1 is ready, it can be transferred to the memory controller to free up the latch. Similar to the read operations for obtaining HB1 and HB2, FIG. 7(D) illustrates the reads to obtain the second soft bit, SB2. This is to provide the quasi SB2 in two sets of 3 reads. In this method two consecutive readings are repeated in the same manner quasi SB1 is generated, once with the threshold set at AR'−ΔR, BR'−ΔR, CR'−ΔR and then with thresholds set at AR'+ΔR, BR'+ΔR, CR'+ΔR. Denote the resulting pages from these two sets as SB21 and SB22 respectively. It will be seen an additional latch is required. SB21 can be stored in one latch while SB22 is stored in another latch. FIG. 7(E) illustrates that SB2 is created as follows: SB2=SB21 XOR NOT (SB22). Meaning activating the same interface circuit for NOT/XOR between the two existing latches.

Thus, it can be seen in the above example of a 2-bit memory example with 12 read points giving rise to 4 bits, the scheme is able to provide an optimal placement of the 12 read points for efficient error correction. At the same time, it has the advantage of employing only one simple circuit/algorithm designed for the multiple sense cycles including the NOT/ XOR interface. The circuit is parameterized by only one parameter, ΔR, that can be adjusted as required. The scheme is unconventional in that the hard bits are now quasi hard bits, based on read reference thresholds slightly offset from the conventional ones used to define the partition of the threshold window during programming. Even more unconventional is that the soft bits have read points (reference thresholds) that are asymmetrically clustered around that of the quasi hard bits. The same scheme can also operate with only one latch instead of two if SB2 is generated using consecutive 6 sense operations in the following order AR'−ΔR, AR'+ΔR, BR'−ΔR, BR'+ΔR, CR'−ΔR and CR'+ΔR. Here as in the previous case t each sense the result is NOT/XOR gated in placed to a single latch. However, in this case the sign of ΔR is changed for each consecutive sense thus the required circuit for such an implementation more complex, on the other hand an entire latch is removed which helps decreasing the cost of the flash control circuitry.

FIGS. 8(A)-8(D) illustrate another example of the read levels and threshold voltage distributions of a 2-bit memory employing only 9 read points to generate 2 HB and "1.5 SB". While 4 bits are actually being obtained and transferred to the memory controller, it is referred to as 1.5 SB in the sense that the sensing is performed over a partition of 10 voltage bands demarcated by the 9 read points. In this example, while the HB are nested with the SB, however SB1 is not nested into SB2. The set of 3 sense operations with programmable parameter AR and fixed distance between the read threshold levels in each set (of 3 read points) (or alternatively fixed AR and constant ΔR parameter which is used with positive and negative offset or not used at all) is maintained as before.

In this example an alternating (−ΔR, +ΔR) values for the shift are employed, i.e., the sense thresholds are set to be AR'−ΔR, AR'+ΔR, BR'−ΔR, BR'+ΔR, CR'−ΔR, CR'+ΔR, however the NOT/XOR sequence is left unchanged. Thus, one latch will suffice with 6 sequential reads and NOT/XOR 'in place' storing.

FIG. 8(A) illustrates the 2-bit distribution of programmed thresholds for a population of memory cells similar to FIG. 4(A).

FIG. 8(B) illustrates the read points for the hard bits which coincide with that of FIG. 4(A). In this example, the read points AR, BR and CR are the same as those that define the partitioning of the threshold window during programming. Unlike the quasi hard bits, they are the original hard bits. As in FIG. 4(B), the HB1 and HB2 are obtained by the 3 reads relative to AR, BR and CR. Since the HB read levels are the same as for read without soft bits, they can be re-used when still stored in the memory controller.

FIG. 8(C) and FIG. 8(D) illustrate the read points for the soft bit, SB1 and SB2 respectively. The read points for SB1 are similar to those for the HB but shifted by −ΔR, viz: AR−ΔR, BR−ΔR, and CR−ΔR. SB1 can be obtained after reading at these three read points. One latch is required per cell for SB1. When the page with SB1 is ready, it can be shifted out to the memory controller, thereby freeing up the latch. Similarly, the read points for SB2 are similar to those for the HB but shifted by +ΔR, viz: AR+ΔR, BR+ΔR, and CR+ΔR. The resulting SB2 can be stored in one latch. When the page with SB2 is ready, it can be shifted out to the memory controller, thereby freeing up the latch.

Figure 7:
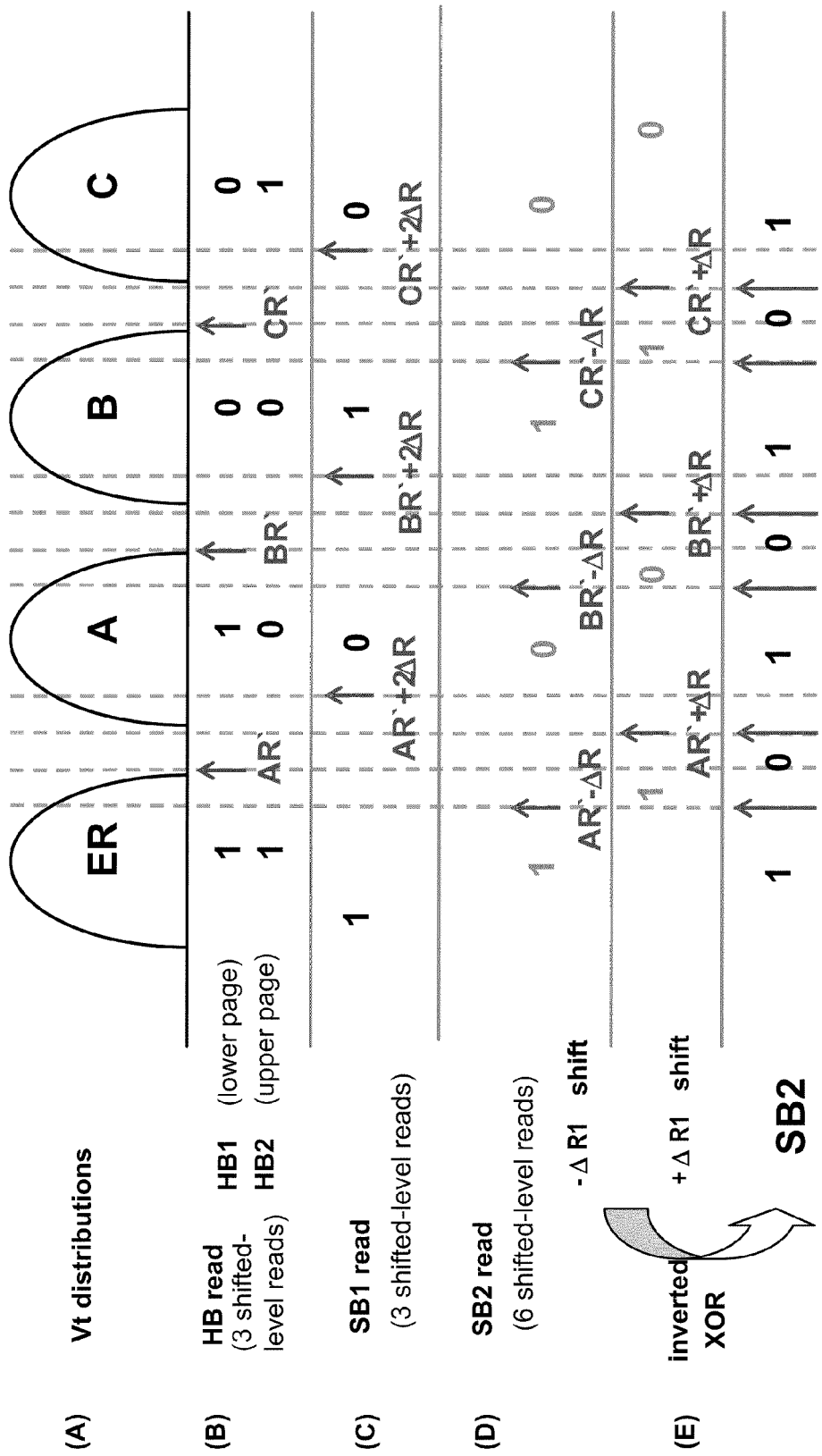
FIGS. 7(A)-7(E) illustrate a first embodiment of the read levels and threshold voltage distributions for a 2-bit memory where the read levels of the soft bits are not symmetrically located relative to the read levels of the hard bits.
Figure 8:
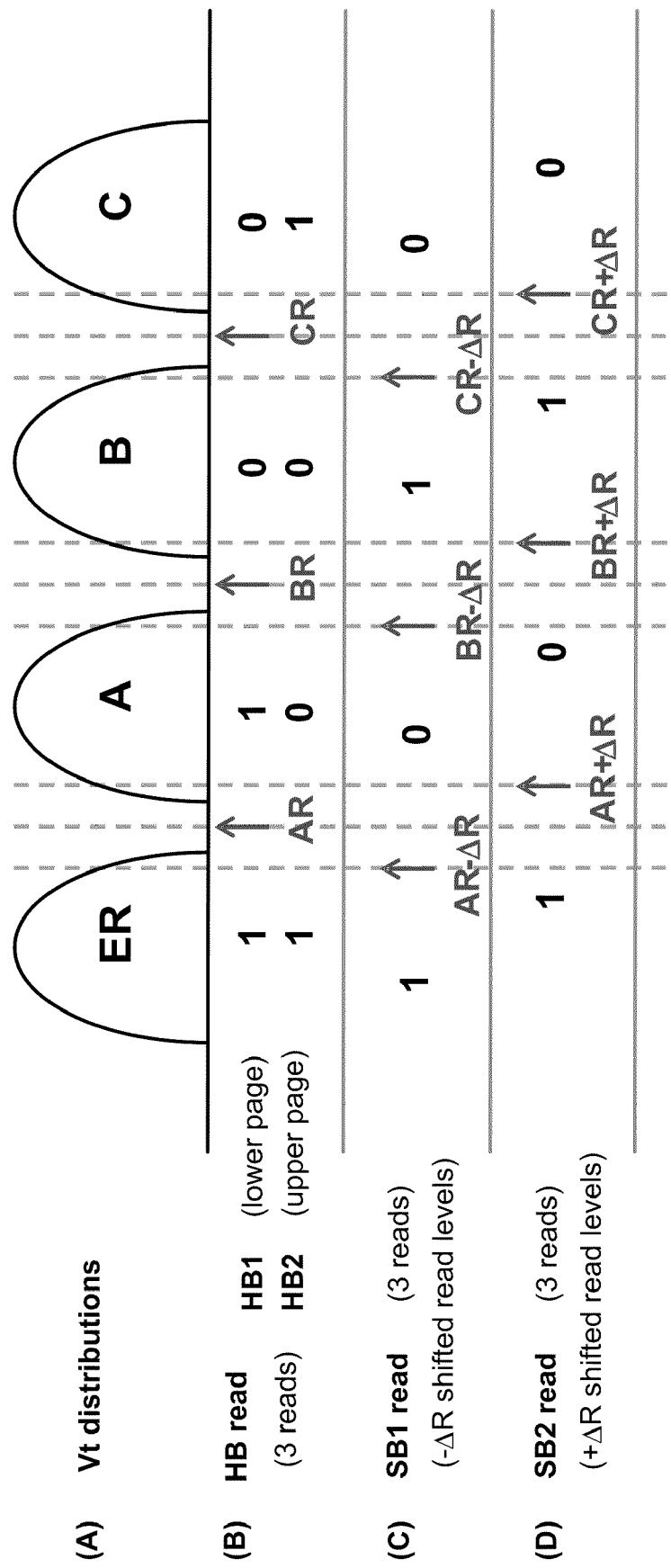
FIGS. 8(A)-8(D) illustrate another example of the read levels and threshold voltage distributions of a 2-bit memory employing only 9 read points to generate 2 HB and 1.5 SB.

Compared to the example shown in FIGS. 7(D)-7(E), only one latch instead of two latches are required per sense amplifier. Note that in the Example shown in FIG. 8, for processing the SB, the second latch of the example in FIGS. 7(D)-7(E), designed to store SB22, can be omitted, and replaced by 6 sequential reads. In this embodiment an alternating (−ΔR, +ΔR) values for the shift are employed, i.e. the sense thresholds are set to be AR'−ΔR, AR'+ΔR, BR'−ΔR, BR'+ΔR, CR'−ΔR, CR'+ΔR, however the NOT/XOR sequence is left unchanged. Nevertheless the ECC (same decoder and code) correction capability with the SB scheme presented in FIG. 7 is higher compared to the one presented in FIG. 8 even though they both resulting with the ECC receiving 4 bits per each read cell assuming that ΔR is optimized separately in these two cases to maximize the mutual information. The reason is that with FIG. 7 scheme more information is sent to the controller compared to FIG. 8 since in FIG. 7 there is a distinction between a total of 13 voltage bands while in the scheme presented in FIG. 8 there are only 10.

Dummy Read Points to Simplify the Read Circuits

FIGS. 9(A)-9(D) illustrates an example of the read levels and threshold voltage distributions of a 2-bit memory with 15 read points. In this case there are two quasi HB and two asymmetric SB. In will be seen there are 4 read cycles. The first has 3 read points, the second, third and fourth each has 4 read points. By adding a dummy read in the first read cycle, all four read cycles would have 4 read points and could be uniformly served by a common read circuit/algorithm.

Figure 9:
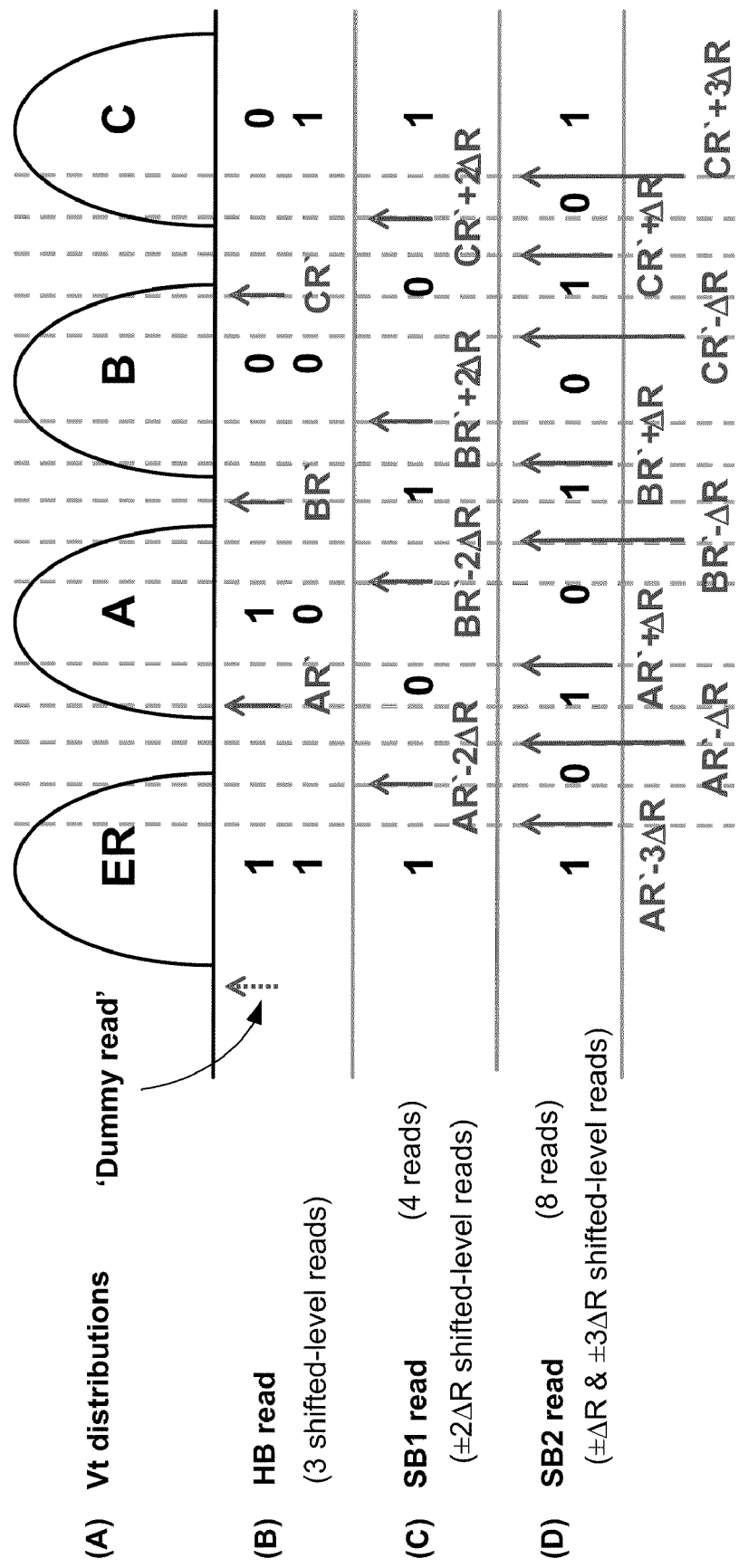
FIGS. 9(A)-9(D) illustrates an example of the read levels and threshold voltage distributions of a 2-bit memory with 15 read points.

FIG. 9(A) illustrates the 2-bit distribution of programmed thresholds for a population of memory cells similar to FIG. 4(A).

FIG. 9(B) shows two quasi HB defined by read points at AR', BR', CR' similar to before. The quasi SB1 requires 4 sense operations with threshold voltages AR'−2ΔR, BR'−2ΔR, BR'+2ΔR, CR'+2ΔR while the quasi SB2 is generated using 8 sequential sense operations AR'−3ΔR, AR'−ΔR, AR'+ΔR, BR'−ΔR, BR'+ΔR, CR'−ΔR, CR'+ΔR, CR'+3ΔR. Thus, this scheme prescribes reading at 3 read points to get HB1 and HB2, reading at another 4 read points to get SB1 and a further reading at another 4+4 read points to get SB2.

As mentioned earlier, in order to make the NOT/XOR operation more systematic, thereby enabling the use of a circuit of simpler design inside the flash memory, it is preferably to implement reading at 4 read points even for the HB. This will allow all bits to be obtained by repeating the same operation of reading of 4 read points that includes the NOT/XOR operation. In a preferred embodiment, the additional read for the HB is implemented by a dummy read for the HB (marked as a dashed arrow in FIG. 9(B)). This additional read point is at the low end of the threshold window so that it will always produce '1' on the entire latch. In this way, the NOT/XOR can be activated on all 3 of the non-dummy read point for the HB sense operations.

Another application of the "dummy read" is in the case of uniform SB readings. It is well known that in order to provide with SB readings for the erase state (for example ER1 and ER21 in FIG. 4(D)) negative sensing is required. Unfortunately negative sensing is limited to how low can the flash array sensing mechanism go in the threshold window and hence in that case the sequence of sense operations can simply disregard them, i.e. avoid these sense operations in order to save on sensing time. This scheme can be employed as long as the ECC decoder in the controller is aware of this sensing scheme and thus take it under consideration when the reliability measures are generated and fed to the soft input ECC decoder accordingly. It was already found that ignoring edge sensing in the erase state (such as ER1 and ER21 in the above FIG. 4(D)) as well as ignoring edge sense operations in the higher state (for example CR1 and CR22) have a negligible impact on a soft input EEC decoder correction capabilities. Fortunately when optimized non-uniform SB are considered there is usually no need to ignore any sense operation due to the fact that all sensing are concentrated around the overlap region between states (for example between the 'ER' state and 'A' state in FIG. 9(A)) and hence deep negative sensing is not required altogether.

In conclusion, the basic building blocks common to all of these schemes are +/−αΔR shifts (with integer value α) on some reference read thresholds. For example, for the 2-bit memory, the reference read thresholds are AR, BR, CR, or AR', BR', CR') that define the HB or quasi HB. The read thresholds for the soft bits are then defined by integral shifts around these reference read voltage thresholds. To obtain an optimal set of read points, the set of reference read thresholds for the HB do not necessarily coincide with the set that defines the memory partition with respect to programming. Furthermore, the read points for the soft bits are typically located asymmetrically around the read points for the hard bits.

Soft-Bit Reads while Reading Hard Bits with DLA Compensation for Coupling

Typically, a group of memory cells on a current word line, WLn, is read in parallel. To read at a given read point (read threshold level), the threshold voltage level is applied to the word line WLn. For memory with a NAND architecture, an adjacent word line WLn+1 is set to Vread so as to turn on the adjacent, daisy-chained memory cell into a pass-through state. Thus, WLn+1 is kept at a constant Vread while WLn steps through different read points.

In embodiments described earlier, the hard and soft bits are generated by modulation of the Vth on WLn while the Vread of WLn+1 is left unchanged.

Accordingly to another aspect of the invention, the soft bits are generated by a combination of a first modulation of voltage on a current word line WLn and a second modulation of voltage on an adjacent word line WLn+1. For example, a first set of read points $V_1, V_2, \ldots, V_i$ for hard bits is set up by modulating WLn while WLn+1 is set to a first predetermined voltage such as Vread. A second set of read points for soft bits is set up as offsets to the first set by also modulating WLn+1 to different Vread values.

This aspect of the invention is particularly synergistically with a known read technique referred to as DLA ("Direct Look-ahead) read. The scheme modulates Vread on WLn+1 in order to read hard bits of memory cells on a current word line, WLn. For the case of 4 states and two bits per cell (e.g. D2) when the read operation employs DLA then each sense operation on WLn is performed 4 times. For example, the read at each of the 3 read reference points Vth1, Vth2 and Vth3 on WLn are repeated 4 times, each time with a different Vread on WLn+1. Only one of these sense operations is separately selected for each cell in WLn according to the state programmed to WLn+1 in order to determine the state of the cell in WLn.

For example, if the memory cells on adjacent word line WLn+1 are individually programmed to any one of states 'E', 'A', 'B' and 'C', then the cells have varying degrees of perturbation on corresponding neighboring cells on WLn. The 'E' state has no charge on the cell's floating gate, the 'A' state has more charge and the 'C' state has the most charge, with increasing coupling level to the floating gates of the corresponding neighboring cells on the current word line, WLn. The higher the coupling level the higher will be the apparent threshold of the cell in WLn be shifted when it is being sensed. The DLA technique applies an offset bias to Vread on WLn+1 during sensing of cells on WLn in order to create a counter coupling to cancel the effects of the coupling level of the neighboring cells located on WLn+1. Thus, while sensing WLn, applying on WLn+1 the bias voltages VreadE, VreadA, VreadB and VreadC respectively will cancel corresponding coupling levels from states 'E', 'A', 'B' and 'C' on the adjacent WLn+1.

U.S. Pat. No. 7,436,733 discloses DLA techniques for compensating for read errors due to perturbations from charges on floating gates of cells at neighboring word lines. The techniques address read errors arising from the perturbation due to a neighboring cell that has no charge when the current cell is programmed verified and subsequently becomes programmed with more charge. The additional neighboring charge has the effect of making the current cell to have a higher threshold than when it was programmed verified. This results in its threshold level being read as higher than when it was programmed verified. DLA read first reads the programmed states of the adjacent cells on WLn and effectively adjusts the read thresholds when reading the cells on WLn. This is accomplished by reading a neighboring word line WLn+1 and biasing Vread, the voltage on WLn+1 accordingly to compensate for the read on the current word line WLn. Essentially, a highly programmed neighboring state will shift the apparent threshold of the current cell up. When reading the current cell, a higher bias of Vread on WLn+1 will help to shift the apparent threshold back to where it should be.

The selected sensing is made according to the state programmed to WLn+1 which is read prior to the read operation of WLn. Due to the large variations on the CC (Cross Coupling) between WLn and WLn+1 this approach turns out to mitigate the coupling between adjacent WL's. Essentially, it works by taking into account the perturbation due to adjacent cell at read time so as to reconstruct the field condition seen by the control gate of the cell during its programming. However, all those sense operations which do not correspond to the Vread applied to WLn+1 during programming are thrown away during the DLA read operation.

The current aspect of the invention makes use of those otherwise wasted sense operations in order to generate alternative SB instead of throwing away the information these sense operation carry with them. This manner of generating SB is referred to as "using DLA outputs as Soft Bits".

This inventive aspect will be illustrated with a 2-bit memory using 12 read points to generate 4 bits for each cell of the group in WLn read in parallel. However, this technique is equally applicable to any number of BPC (Bits per Cell) and any number of SB up to and including BPC. This means that for the 2-bit memory we can get on top of the 2 quasi hard bits another 2 soft bits. For a 3-bit memory, we can generate on top of the 3 quasi hard bits per cell another 3 SB etc.

Figure 10:
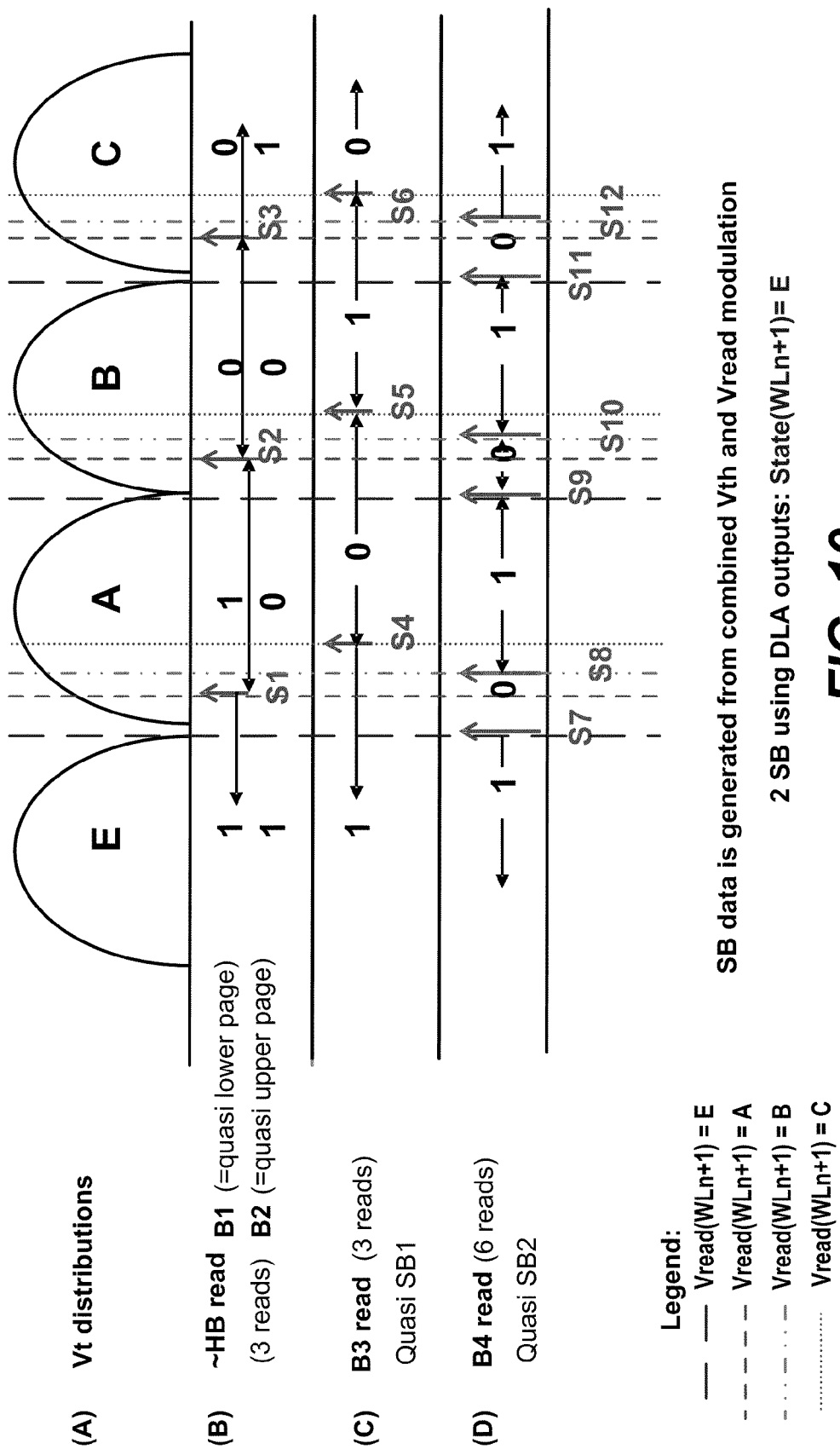
FIGS. 10(A)-10(D) illustrate an example of the read levels and threshold voltage distributions of a 2-bit memory using 12 read points in which the read points are set by a combination of voltage modulations of both WLn and WLn+1, and the neighboring state on WLn+1 is at state 'E'.

FIGS. 10(A)-10(D) illustrate an example of the read levels and threshold voltage distributions of a 2-bit memory using 12 read points in which the read points are set by a combination of voltage modulations of both WLn and WLn+1. FIG. 10(A) illustrates the CVD's of cells in WLn for which the neighboring cell in the same BL in WLn+1 is programmed to the 'E' (Erase) state. This is the case where there are no WLn+1 perturbation. The HB and SB are generated by a set of 12 read points, viz: S1, S2, . . . , S12, according to a possible set of reads performed sequentially. The set of 12 read points can be generated from a group of 3 reference points $Vth_1$, $Vth_2$ and $Vth_3$ to be applied to WLn. These values are further shifted depends on the value of Vread on WLn+1.

FIG. 10(B) illustrates the first three reads on S1, S2 and S3 being performed with $Vth_1$, $Vth_2$ and $Vth_3$ on WLn respectively while the voltage Vread on WLn+1 is set to a predetermined value corresponding to the programmed state 'A' on WLn+1. This Vread value will be denoted as Vread[A]. Upon completion of the third read, two quasi HB (hard bits) are generated in a similar manner to the "normal read" procedure. These two bits are denoted as quasi HB. They use only modulation on WLn without any change to the Vread applied to WLn+1.

Figure 11:
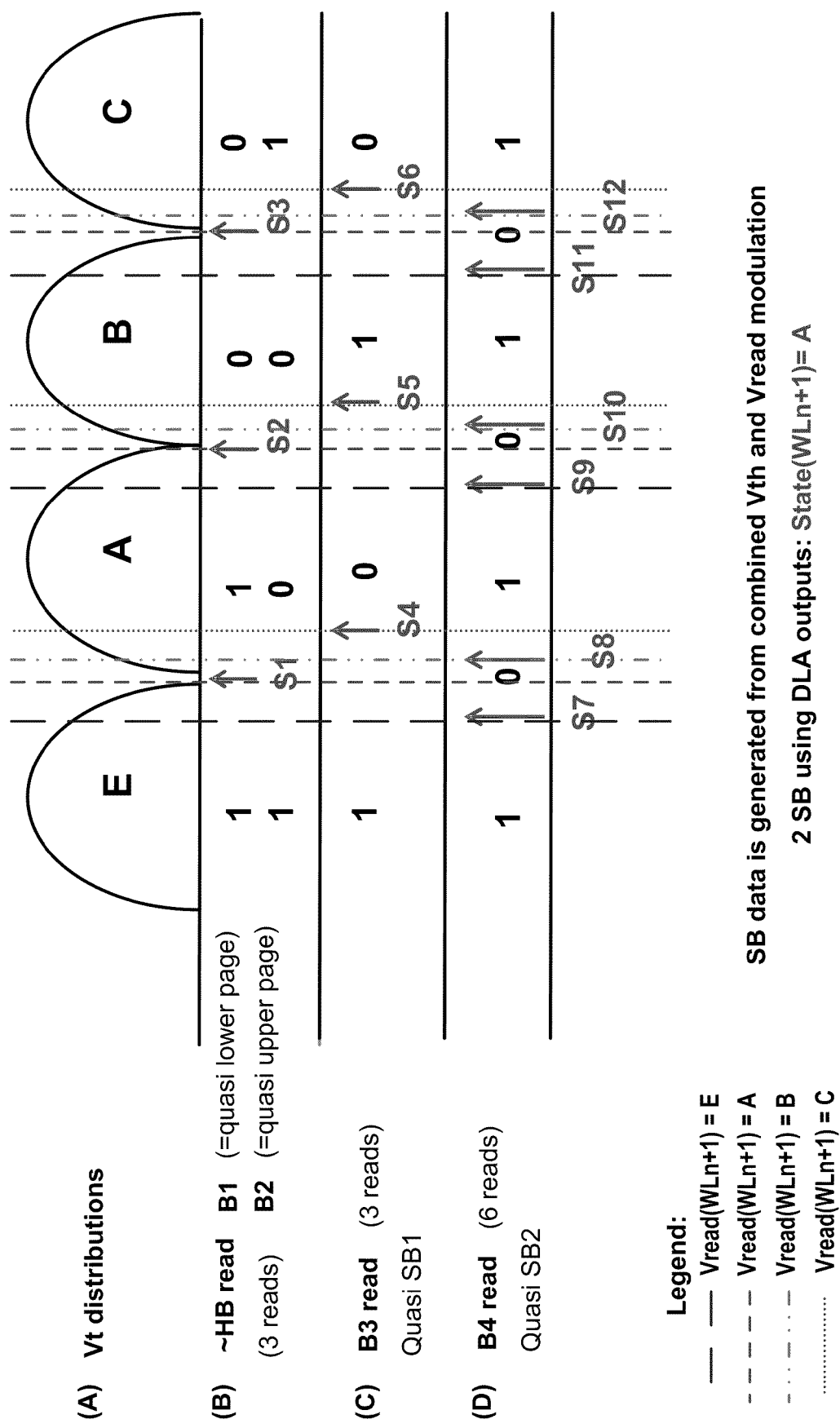
FIGS. 11(A)-11(D) illustrate an example of the read levels and threshold voltage distributions of a 2-bit memory using 12 read points in which the read points are set by a combination of voltage modulations of both WLn and WLn+1, and the neighboring state on WLn+1 is at state 'A'.
Figure 12:
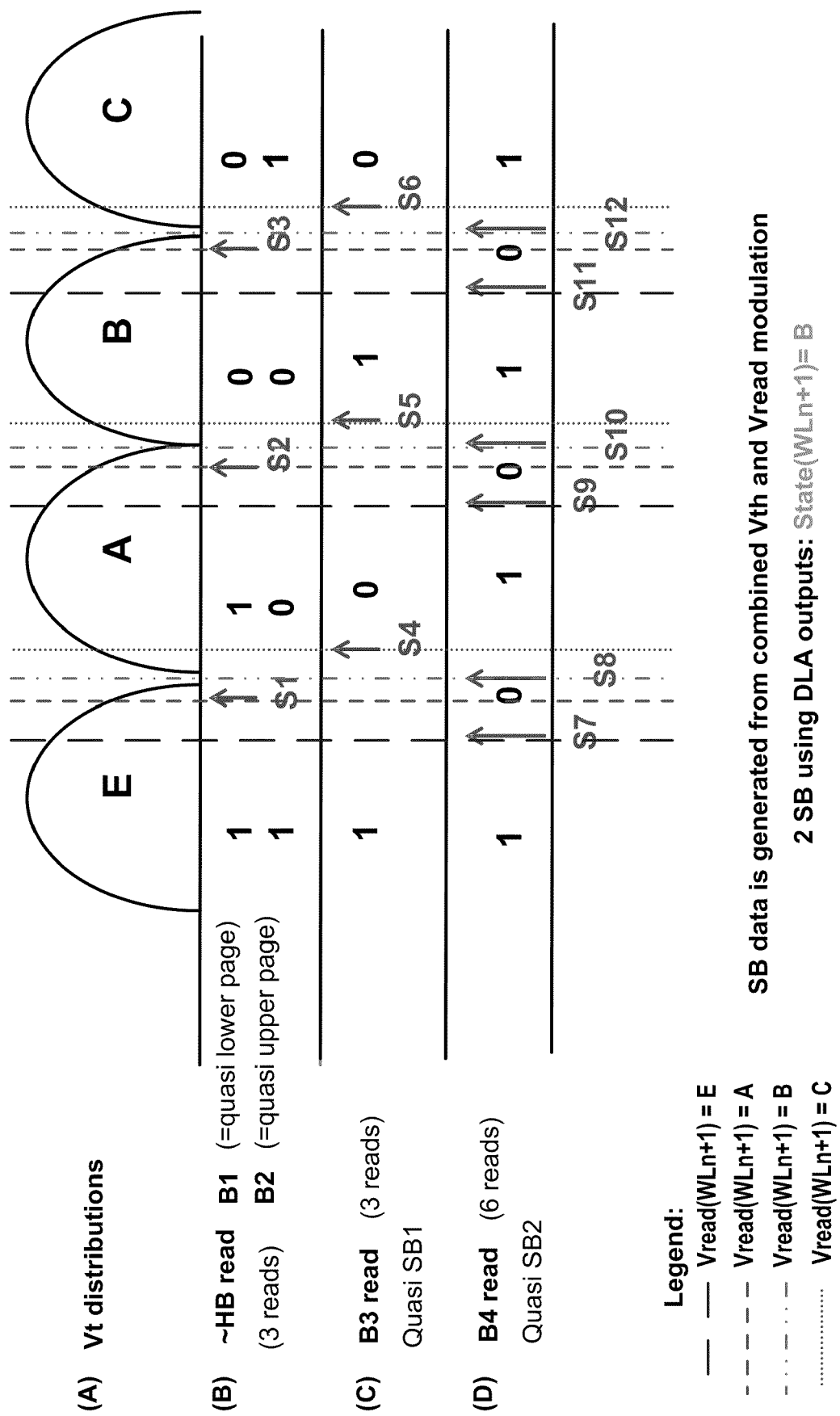
FIGS. 12(A)-12(D) illustrate an example of the read levels and threshold voltage distributions of a 2-bit memory using 12 read points in which the read points are set by a combination of voltage modulations of both WLn and WLn+1, and the neighboring state on WLn+1 is at state 'B'.
Figure 13:
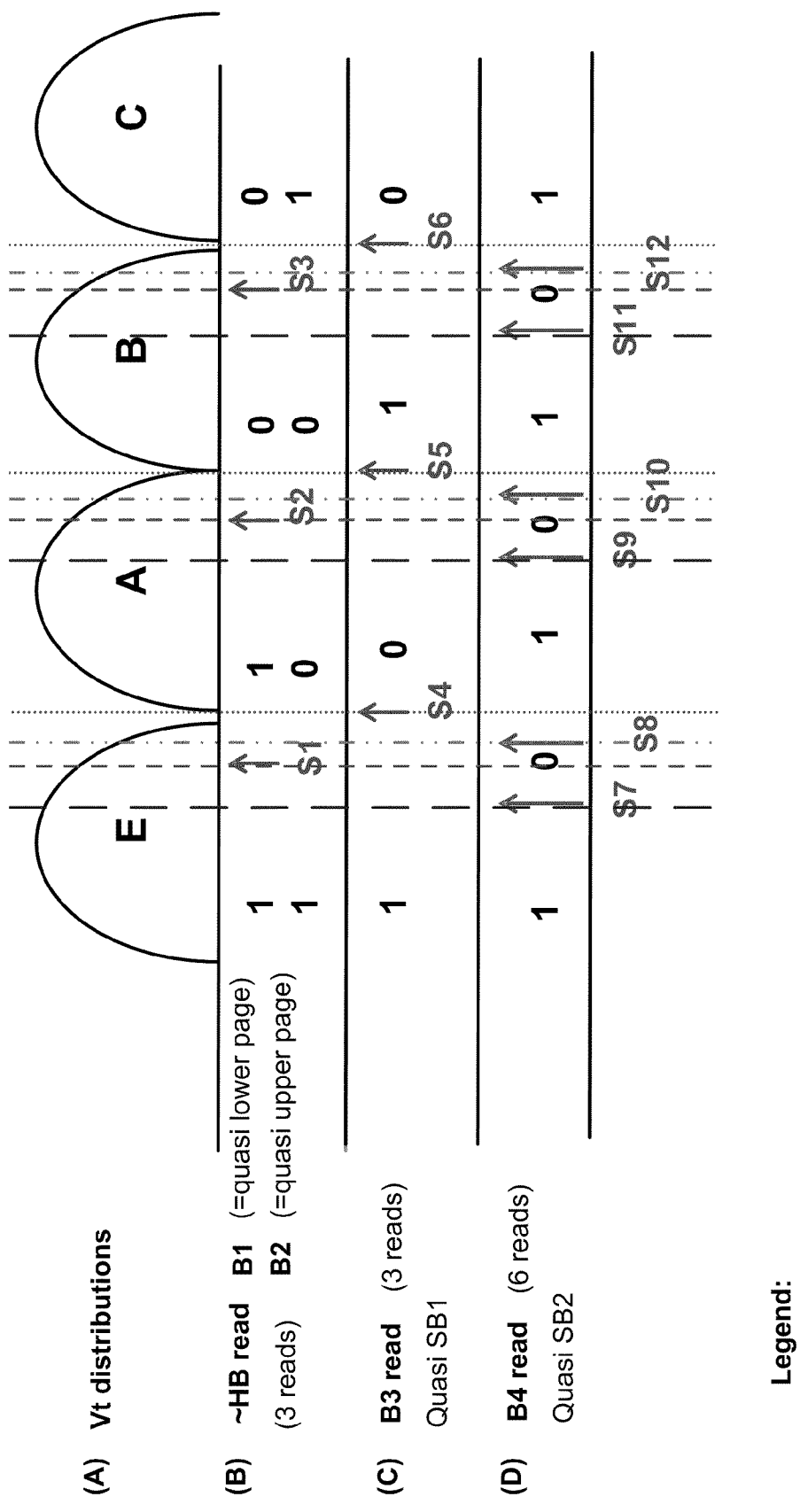
FIGS. 13(A)-13(D) illustrate an example of a 2-bit memory using 12 read points in which the read points are set by a combination of voltage modulations of both WLn and WLn+1, and the neighboring state on WLn+1 is at state 'C'.
Figure 14:
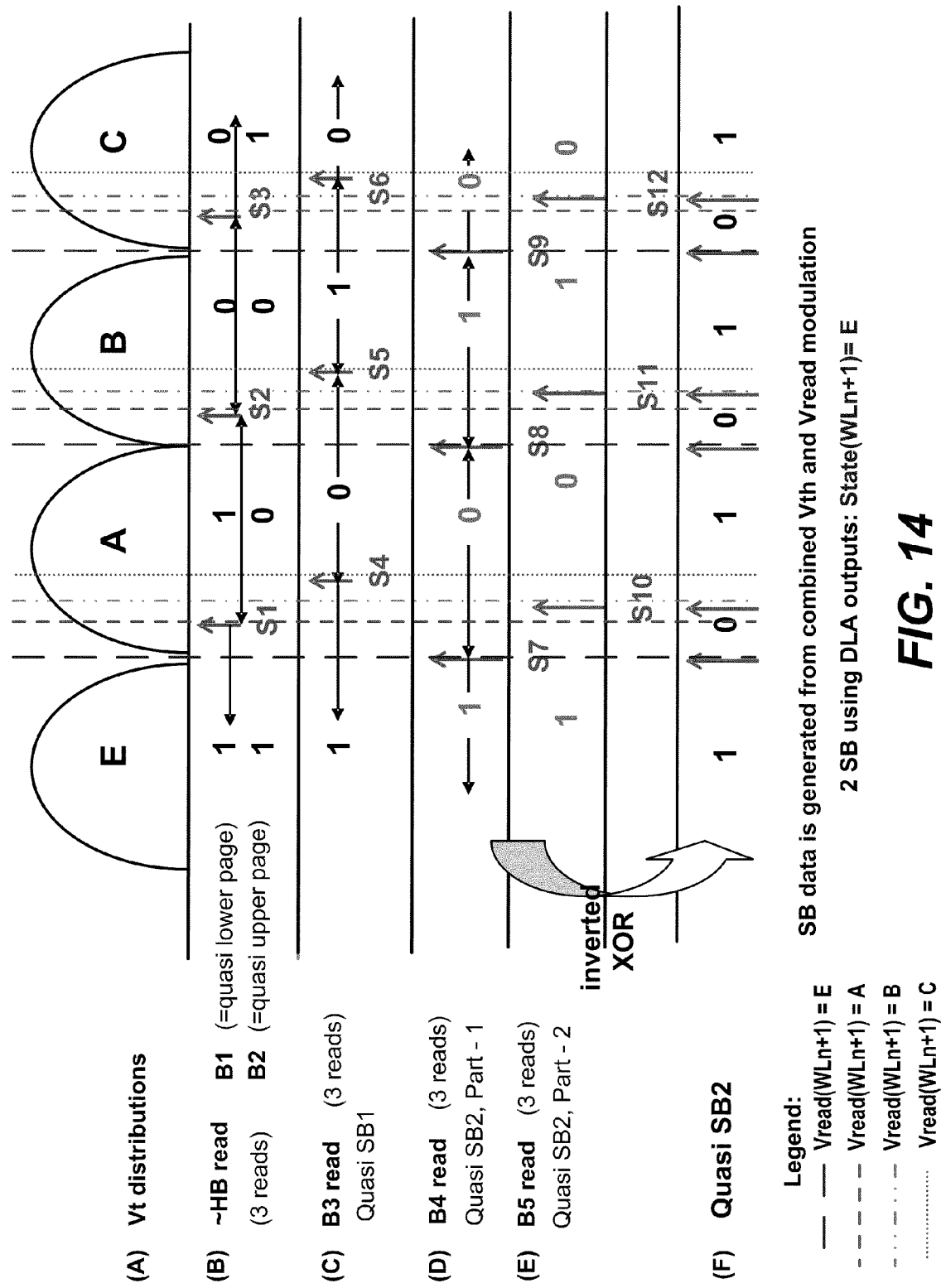
FIGS. 14(A)-14(F) illustrate an alternative example of the read levels and threshold voltage distributions of a 2-bit memory using 12 read points in which the read points are set by a combination of voltage modulations of both WLn and WLn+1, and the neighboring state on WLn+1 is at state 'E'.
Figure 15:
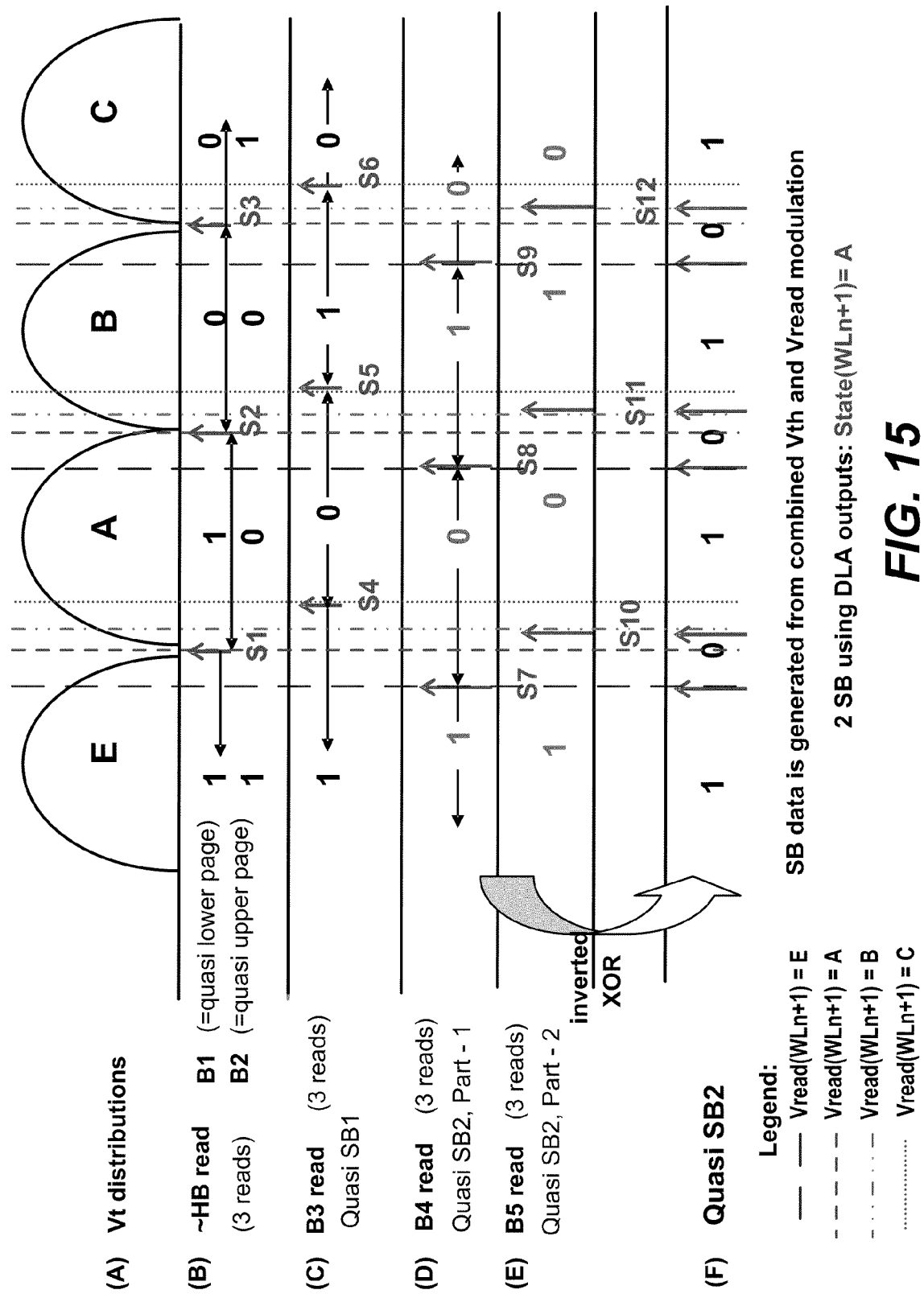
FIGS. 15(A)-15(F) illustrate an alternative example of the read levels and threshold voltage distributions of a 2-bit memory using 12 read points in which the read points are set by a combination of voltage modulations of both WLn and WLn+1, and the neighboring state on WLn+1 is at state 'A'.
Figure 16:
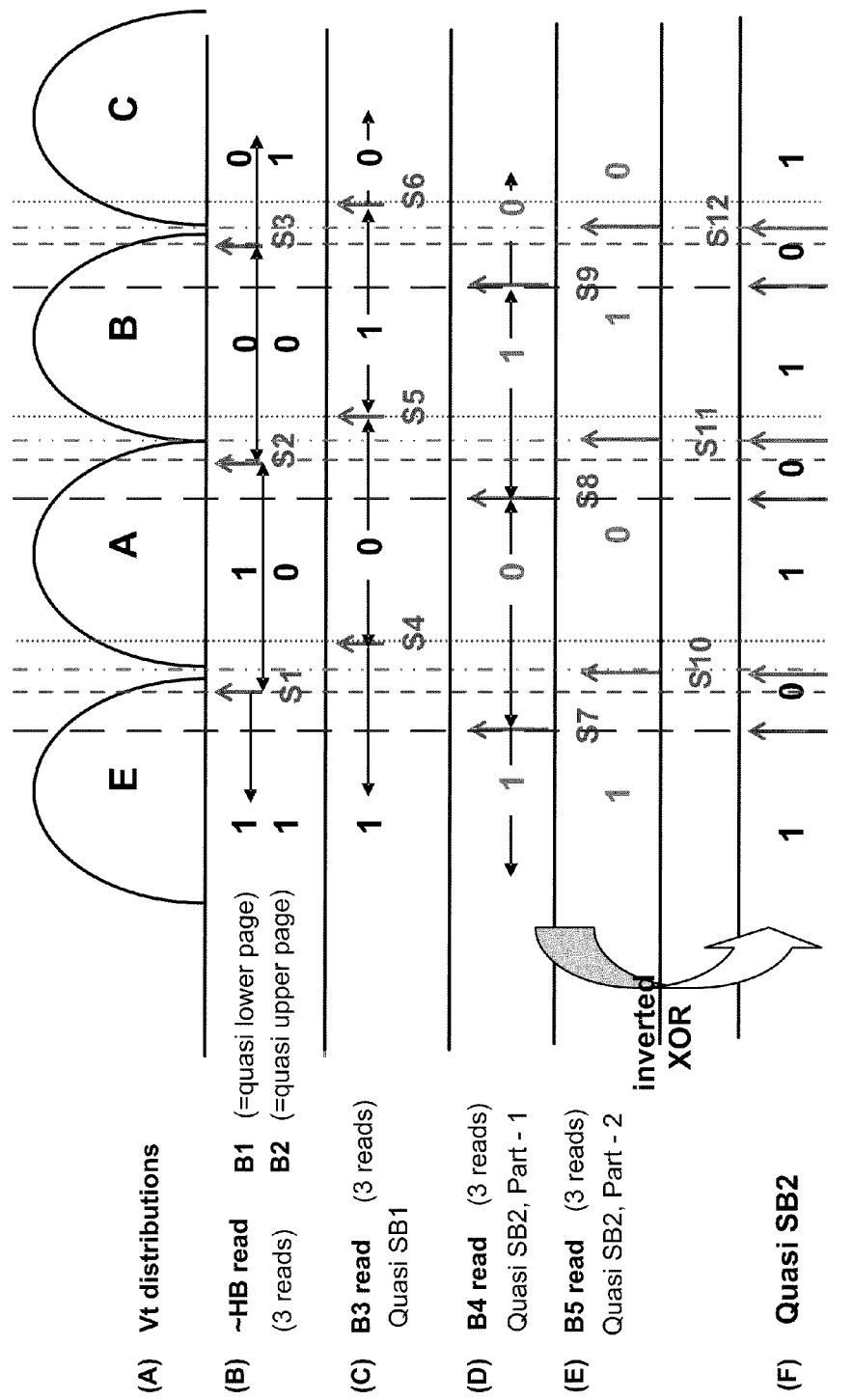
FIGS. 16(A)-16(F) illustrate an alternative example of the read levels and threshold voltage distributions of a 2-bit memory using 12 read points in which the read points are set by a combination of voltage modulations of both WLn and WLn+1, and the neighboring state on WLn+1 is at state 'B'.

Furthermore the CVD's of the 4 states in WLn depend on the modulation on WLn+1. This last dependency can be observed on the following FIG. 11 to FIG. 13. The position of the CVD's with respect to the same 3 sense operation for the case of cells which their neighboring cell on the same BL in WLn+1 is programmed to state 'A', 'B' and 'C' is depicted in FIG. 11(B), FIG. 12(B) and FIG. 13(B) respectively. It will be seen that the apparent threshold distribution is progressively shifted to a lower threshold value with increasingly programmed states on WLn+1. E.g. as the state in WLn+1 is higher it seems as if the threshold of WLn appears to be lower on the same CVD distribution.

FIG. 10(C) to FIG. 13(C) illustrate reading at S4-S6 respectively for neighboring state on WLn+1 being 'ER', 'A', 'B' and 'C'. The reading at S4, S5 and S6 is respectively produced with $Vth_1$, $Vth_2$ and $Vth_3$ on WLn while Vread on WLn+1 is set to a predetermined value corresponding to the programmed state 'C' on WLn+1. Denote this last Vread value as Vread[C]. The latch L1 is fed with '1' for all cells conducting on this 4th sense operation. The reading at S5 is produced with S5 on WLn while Vread on WLn+1 is set to Vread[C]. The latch L2 is fed with '1' for all cells conducting on this $5^{th}$ sense operation. The final result in the latch is fed with NOT/XOR between two values 'L1' and 'L2'. Note that alternatively to using L1 and L2 a single latch can be used while first it is fed in the same way L1 is fed, and then after sensing S5 the result from the sense amplifier is directly XOR'ed with NOT on the single latch already set.

The reading at S6 is produced with S6 on WLn while Vread on WLn+1 is set to Vread[C]. The latch is updated in the same manner as after the S5 sense operation e.g., using the NOT/XOR operation. At this point, the flash memory can provide with the first quasi SB denoted as 'B3' using only one latch and the NOT/XOR logic mentioned above. The B3 data can be sent to the controller (memory processor/decoder) and then the latch is cleared.

FIG. 10(D) to FIG. 13(D) illustrate reading at S7-S12 respectively for neighboring state on WLn+1 being 'ER', 'A', 'B' and 'C'. The reading at S7, S9 and S11 is respectively produced with $Vth_1$, $Vth_2$ and $Vth_3$ on WLn while Vread on WLn+1 is set to a predetermined value corresponding to the programmed state 'ER' on WLn+1. The reading at S8, S10 and S12 is respectively produced with $Vth_1$, $Vth_2$ and $Vth_3$ on WLn while Vread on WLn+1 is set to a predetermined value corresponding to the programmed state 'B' on WLn+1.

Thus, the $7^{th}$ sense operation at S7 is produced with $Vth_1$ on WLn while Vread on WLn+1 is set to a predetermined value corresponding to the programmed state 'ER' on WLn+1. Denote this last Vread value as Vread[E]. As before the latch is fed with '1' for all cells conducting after this sense. The 8th sense operation at S8 is produced with $Vth_1$ on WLn while Vread on WLn+1 is set to a predetermined value corresponding to the programmed state 'B' on WLn+1. Denote this last Vread value as Vread[B]. The latch is updated in the same manner as after the 5th sense operation e.g., using the NOT/XOR routine.

The $9^{th}$ sense operation at S9 is produced with $Vth_2$ on WLn while Vread on WLn+1 is set to Vread[E]. The latch is updated in the same manner as after 5th sense e.g. using the NOT/XOR routine. The $10^{th}$ sense operation at S10 is produced with $Vth_2$ on WLn while Vread on WLn+1 is set to Vread[B]. The latch is updated in the same manner as after 5th sense e.g. using the NOT/XOR routine.

The $11^{th}$ sense operation at S11 is produced with $Vth_3$ on WLn while Vread on WLn+1 is set to Vread[E]. The latch is updated in the same manner as after $5^{th}$ sense e.g. using the NOT/XOR routine. The $12^{th}$ sense operation at S12 is produced with $Vth_3$ on WLn while Vread on WLn+1 is set to Vread[B]. The latch is updated in the same manner as after $5^{th}$ sense e.g. using the NOT/XOR routine. At this point, the last of the 4 bits, denoted as B4 can be sent outside the flash to the controller for decoding. In some implementation of sensing circuits for flash devices there is an advantage not to change both Vread on WLn+1 and on WLn. In these case the same result can be achieved when first setting the Vread on WLn+1 to Vread[E] then updating a single latch with S7,S9 and S11. After which changing the Vread on WLn+1 to Vread[B] and filling a second latch according to S8,S10 and S12. Then apply the NOT XOR operation on the pair of latches e.g. the first and second latches placing the result in one of them (or on a third latch) while only the result is transferred to the controller. In this case, another latch is required but the sensing circuit is made simpler. More details for this scheme are provided below with respect to FIG. 14-FIG. 17.

Note that the order of the above sense operation is not the only way to generate a set of 4 bits in grey coding. The above choice for grey coding is depicted in Table 1.

TABLE 1

SB as DLA output coding

| B1 | 1 | 1 | 1 | 1 | 1 | 1 | 0 | 0 | 0 | 0 | 0 | 0 | 0 |
| B2 | 1 | 1 | 0 | 0 | 0 | 0 | 0 | 0 | 0 | 0 | 1 | 1 | 1 |
| B3 | 1 | 1 | 1 | 1 | 0 | 0 | 0 | 0 | 1 | 1 | 1 | 1 | 0 |
| B4 | 1 | 0 | 0 | 1 | 1 | 0 | 0 | 1 | 1 | 0 | 0 | 1 | 1 |

The advantages of the embodiment described above are in its simplicity and requirement for only one latch in the flash device. Furthermore, the fact that grey coding is employed increases the reliability (minimizing the number of bit errors) in cases of transitions from one state to another during read. Another advantage with this embodiment is that modulation is also made easier since the first 3 sense operations is modulated to $Vth_1$, $Vth_2$, $Vth_3$ on WLn while Vread for WLn+1 is kept unchanged at Vread[A]. Then another 3 sense operations are being made with the same $Vth_1$, $Vth_2$, $Vth_3$ on WLn while this time WLn+1 is kept at Vread[C]. The last set of 6 sense operations are made with repeating twice each Vth, i.e. $Vth_1$, $Vth_1$, $Vth_2$, $Vth_2$, $Vth_3$, $Vth_3$ on WLn while on WLn+1 alternating Vread between Vread[E] and Vread[B].

In order to make this approach even simpler, it will be desirable to modulate Vth on WLn only without having to change modulation on WLn+1 in between, for each set of sense operation designated to fill up one latch until it is cleared and sent for further digital processing.

FIGS. 14 to 17 illustrate another embodiment which uses an additional latch in processing the soft bits so as to avoid changing modulation on WLn+1 while reading at each of $Vth_1$, $Vth_2$ and $Vth_3$ at WLn. The method is similar to that described in connection with FIG. 7, but uses DLA output e.g., it modulates Vread on WLn+1 instead of only modulating WLn Vth values.

FIGS. 14(A)-(C) to FIGS. 17(A)-(C) are the same as FIGS. 10(A)-(C) to FIGS. 13(A)-(C). The difference is in FIGS. 14(D)-(E) to FIGS. 17(D)-(E) as compared to FIG. 10(D) to FIG. 13(D). The last cycle of 6 sense operations in FIG. 10(D) to FIG. 13(D) is divided into two sub-cycles in FIG. 14(D)-(F) to FIG. 17(D)-(F).

FIGS. 14(D)-17(D) illustrate a first sub-cycle of read for the quasi SB2. While WLn is modulating at $Vth_1$, $Vth_2$ and $Vth_3$, Vread of WLn+1 is kept at Vread[E].

FIG. 14(E)-17(E) illustrate a second sub-cycle of read for the quasi SB2. While WLn is modulating at $Vth_1$, $Vth_2$ and $Vth_3$, Vread on WLn+1 is maintained at Vread[B].

FIG. 14(F)-17(F) illustrate that a quasi SB2 is created as follows: quasi SB2=(quasi SB2 Part-1) XOR NOT (quasi SB2 Part-2).

In this way a unified sensing scheme is repeated for all cycles with 3 sense operations per cycle at $Vth_1$, $Vth_2$ and $Vth_3$ while for each of the 4 cycles different Vread is applied to WLn+1. These 4 Vread values are applied in the following order Vread[A], Vread[C], Vread[E], Vread[B]. This scheme further simplifies the implementation without increasing the total number of latches and hence is the preferred embodiment for the example of 2-bit flash memory.

It is clear this method of using DLA outputs to generate SB belongs to the family of non-nested SB generation. The obvious reason is that upon taking just the first two bits or the first 3 bits out of the 4 bits does not provide the best read HB as in the DLA case. Only the entire set of 4 bits (in the above example) provides better estimation than the normal DLA read operation operative for a soft input decoder while keeping the same number of sense operations (12 in this case).

These readings (which in normal DLA read operation of the flash device are thrown away) are used advantageously to increase the correction capabilities of a soft input ECC decoder and hence result with system wise increasing the reliability of read operations. The following is a simple example of one of the many ways to take advantage of this information.

On top of the 4 bits provided by the above example scheme, the decoder also receives the information on the estimated programmed state for each cell on WLn+1. The decoder can at this point use 6 bits for each cell in WLn. The method relies on empirical measurements of the flash device made either during design or during production. The measurements and LLR settings can also be updated during the lifetime of the device as a background process.

Separately for each neighboring state in WLn+1 all cells in WLn are taken. For example, all cells in WLn with neighbor cell in the same BL and in WLn+1 programmed to 'ER' are grouped together. This generates 4 groups of cells, denoted as Eg, Ag, Bg, Cg.

If for example there are 64K cells in a WL each group holds approximately 16K cells. 'Eg' refers to the group of cells in WLn with neighboring cell in WLn+1 programmed to state 'ER'. 'Ag' refers to the group of cells in WLn with neighboring cell in WLn+1 programmed to state 'A'. 'Bg' refers to the group of cells in WLn with neighboring cell in WLn+1 programmed to state 'B'. 'Cg' refers to the group of cells in WLn with neighboring cell in WLn+1 programmed to state 'C'.

Now for each such group the cells are further divided into 4 groups according to the state programmed to WLn. For example, Eg group is divided into Ege, Ega, Egb, and Egc. At this point the 4 bit value of each cell in each group is used to build a state transition matrix of 4 rows and 13 columns which holds the probability of each cell programmed to state represented in row 'j' (from 0 to 3) to be read in column 'k' (from 0 to 12).

For example assume there are 4K cells (4,000 cells) in 'Ega' group then at location j=1 (corresponding to WLn being programmed to state A) and column k=3 corresponding to the '$m_1$' cells being read as '1011' (see the 4th column in the above Table 1) the entry in the transition matrix at row 1 and column 3 is set to $m_1/4K$.

Another example to clarify the creation of another entry in this transition matrix would be to count the number of cells in group 'Egc' which are programmed as 'C' state to WLn (e.g. j=3) and then using the above read operation. The 4 bits received are '0011' corresponding to column k=8 (starting at 0) in the above Table 1. If this count is $m_2$ and the number of cells in group 'Egc' is also 4K then the entry in the transition matrix at row 3 and column 8 is set to $m_2/4K$.

Denote that a separate transition matrix of size 4×13 is generated for each of the 4 groups Eg, Ag, Bg, and Cg. This state transition matrix is now employed to generate 2 reliability values for each of the 13 columns. One option to represent this reliability value is in the form of LLR. (Log Likelihood Ratio).

This means to compute the value $LLR=\log_2(Pr_0/Pr_1)$. Here $Pr_0$ refers to the sum of probabilities for the corresponding bit in the cell of WLn to be '0' while $Pr_1$ refers to the sum of probabilities for the same bit to be '1' given the 4 bits read from the cell according to the above "use DLA outputs as SB" procedure.

For example if in the 4×13 transition matrix column 'j' holds probabilities $Q_0, Q_1, Q_2, Q_3$ and the mapping of the target cell in WLn to bits is the standard grey mapping as in Table 2:

TABLE 2

Example Column

| [MSBit LSBit] | Probabilities in column 'k' of state transition matrix |
|---|---|
| 11 | $Q_0$ |
| 10 | $Q_1$ |
| 00 | $Q_2$ |
| 01 | $Q_3$ |

Then the LLR of MSBit and LSBits are $\log_2([Q_2+Q_3]/[Q_1+Q_0])$ and $\log_2([Q_2+Q_1]/[Q_3+Q_0])$ respectively. Note that $Q_0, Q_1, Q_2, Q_3$ are empirically measured using the method discussed in the last 3 paragraphs (in the example for j=1, e.g., $Q_1=m_0/4K$ in column 3, j=3, e.g., $Q_3=m_1/4K$ in column 8, . . . ). Upon completing this off-line computation, a table is provided with 13 entries, and two LLR's in each entry. Such table is separately generated for each of the above 4×13 transition matrixes, resulting in total of 4 tables of 13×2 values.

Since the values in the 13 columns are in grey coding a table of 16 entries is required out of which only 13 entries are employed. Using the above Table 2 example and defining B1 to be the MSBit and B4 to be the LSBit those entries are: 15, 14, 10, 11, 9, 8, 0, 1, 3, 2, 6, 7, 5.

Using said 4 tables of 16×2 values each, in the decoding process is done as follows:

First WLn+1 is read generating two bits for each cell in the normal old fashion manner applying $Vth_1, Vth_2$ and $Vth_3$ on the control gate of WLn+1. Denote these bits as '$D_1 D_0$'. Denote as 'D' an integer from 0 to 3 these two bits represent.

Now 4 bits are read from each cell on WLn as explained above, i.e., modulating both $V_{th}$ of WLn and Vread of WLn+1. Denote these bits as '$B_3 B_2 B_1 B_0$' for each cell in WLn. Denote as 'B' an integer between 0 and 15 (with only 13 valid options) these 4 bits represent (according to Table 1).

Use 'D' to point to one of the 4 LLR tables. Use 'B' to choose the two LLR's located in table 'D' at address 'B'. Extract these two LLR's representing the reliability of the bits in the cell of WLn and feed them to a soft input decoder which is defined on a large number of cells in WLn to reconstruct the bits programmed to those cells in WLn. As the code could be constructed on each of the upper and lower pages separately then in another embodiment just of these two LLR values is employed on a specific page decoding operation while the other LLR is used when the second page is decoded. Obviously that would mean that on each computation of the two LLR's one is thrown away.

The advantage of the invention is the increase of read speed and reduced energy consumption when better matching the required correction capability of the controller to the data located in the flash device. Another positive outcome is that this advantage is provided W/O increasing the digital circuits required in the flash device with higher cost unlike the digital circuits in the controller for which cost is reduced when digital technology shrinks according with the advance in the lithography generation.

The foregoing detailed description of the invention has been presented for purposes of illustration and description. Even though a 2-bit memory is used to illustrate the principles, the invention is equally applicable to memory capable of storing 3, 4 or other bits of data. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of reading a cell of a non-volatile memory, the cell having a threshold window demarcated by a first set of (L−1) reference thresholds into a first set of L bands, with L being an integer >1, and the cell having being programmed with a threshold among one of the L bands, said method comprising:

setting a second set of (L+M−1) reference thresholds for demarcating the threshold window into a second set of (L+M) bands, with M being an integer >0, the reference thresholds of the second set being distributed non-uniformly in the threshold window with higher density around locations that coincide with the reference thresholds of the first set, and wherein the first set of reference thresholds is not a subset of the second set; and reading the cell by locating the band in the second set containing the programmed threshold.

2. The method as in claim 1, further comprising:
designating a different x-bit code word for each of the L bands of the first set, where 2**x>=L;
designating a different (x+y)-bit code word for each of the (L+M) bands of the second set, where 2**(x+y)>=L+M; and
reading out a (x+y)-bit code word designating the band of the second set containing the programmed threshold.

3. The method as in claim 2, further comprising:
processing the read-out (x+y)-bit code word with an error correcting code (ECC) decoder to obtain an error-corrected x-bit code word for the cell.

4. The method as in claim 3, wherein:
said setting of reference thresholds of the second set is distributed across the threshold window non-uniformly to optimize the ECC decoder processing of the (x+y)-bit code word.

5. The method as in claim 3, further comprising:
predetermining an expected cell error rate (CER) for the cell; and
employing sufficiently large values of M and y for the ECC decoder to correct the predetermined CER.

6. The method as in claim 3, further comprising:
determining sufficient values for M and y by trial and error, by progressively increasing M and y until the ECC decoder is able to obtain the error-corrected x-bit code word for the cell; and
employing the determined sufficient values of M and y for subsequent reading of the cell.

7. The method as in claim 1, wherein:
the cell is connected to a first word line and is also affected by a voltage on an adjacent word line; and
said setting of reference thresholds of the second set is by permuting a first set of voltages on the first word line and a second set of voltages on the adjacent word line.

8. The method as in claim 1, wherein:
the second set of reference thresholds are divided into multiple groups each having substantially similar number of reference thresholds; and
reading the cell bit-by-bit by sensing the cell relative to each of the multiple groups of reference thresholds.

9. The method as in claim 8, further comprising:
providing an additional dummy read at a dummy reference threshold of no consequence so as to make the number reference thresholds in a group identical to the other groups.

10. The method as in claim 1, wherein:
the cell is one of a group of memory cells of the non-volatile memory that are operated on in parallel.

11. A non-volatile memory, comprising:
a cell having a threshold window demarcated by a first set of (L−1) reference thresholds into a first set of L bands, with L being an integer >1, said cell having being programmed with a threshold among one of the L bands;

a second set of (L+M−1) reference thresholds for demarcating the threshold window into a second set of (L+M) bands, with M being an integer >0, the reference thresholds of the second set being distributed non-uniformly in the threshold window with higher density around locations that coincide with the reference thresholds of the first set, and wherein the first set of reference thresholds is not a subset of the second set; and a read circuit for reading the cell by locating the band in the second set containing the programmed threshold.

12. The non-volatile memory as in claim 11, further comprising:
a different x-bit code word for each of the L bands of the first set, where 2**x>=L;
a different (x+y)-bit code word for each of the (L+M) bands of the second set, where 2**(x+y)>=L+M; and
wherein said read circuit for reading out a (x+y)-bit code word designating the band of the second set containing the programmed threshold.

13. The non-volatile memory as in claim 12, further comprising:
an error correcting code (ECC) decoder;
said ECC decoder processing the read-out (x+y)-bit code word with an error correcting code (ECC) decoder to obtain an error-corrected x-bit code word for the cell.

14. The non-volatile memory as in claim 13, wherein:
said reference thresholds of the second set are distributed non-uniformly across the threshold window to optimize the ECC decoder processing of the (x+y)-bit code word.

15. The non-volatile memory as in claim 13, further comprising:
a predetermined expected cell error rate (CER) for the cell; and
wherein said different (x+y)-bit code word for each of the (L+M) bands of the second set having sufficiently large values for M and y for the ECC decoder to correct the predetermined CER.

16. The non-volatile memory as in claim 13, wherein:
said different (x+y)-bit code word for each of the (L+M) bands of the second set having sufficiently large values for M and y are determined by trial and error, progressively with increasing M and y at each trail until the ECC decoder is able to obtain the error-corrected x-bit code word for the cell; and
said reading circuit is responsive to the determined sufficiently large values of M and y for subsequent reading of the cell.

17. The non-volatile memory as in claim 11, further comprising:
a first word line connected to the cell;
an adjacent word line having a voltage that affects the cell; and
wherein said setting of reference thresholds of the second set is formed by permuting a first set of voltages on the first word line and a second set of voltages on the adjacent word line.

18. The non-volatile memory as in claim 11, wherein:
the second set of reference thresholds consists of multiple groups each having substantially similar number of reference thresholds; and said read circuit reading the cell bit-by-bit by sensing the cell relative to each of the multiple groups of reference thresholds.

19. The non-volatile memory as in claim 18, further comprising:
an additional dummy reference threshold included in a group in said second set, thereby making the number of reference thresholds in each group identical; and wherein said read circuit reading relative to the group including or not including the dummy reference threshold yields the same result.

20. The non-volatile memory as in claim 11, wherein:
the cell is one of a group of memory cells of the non-volatile memory that are operated on in parallel.

* * * * *

UNITED STATES PATENT AND TRADEMARK OFFICE
CERTIFICATE OF CORRECTION

PATENT NO. : 8,099,652 B1
APPLICATION NO. : 12/978322
DATED : January 17, 2012
INVENTOR(S) : Alrod et al.

It is certified that error appears in the above-identified patent and that said Letters Patent is hereby corrected as shown below:

On the Title page, item (73) Assignee, delete "SanDisk Corporation" and insert --SanDisk IL Ltd.--.

Signed and Sealed this
Third Day of July, 2012

David J. Kappos
*Director of the United States Patent and Trademark Office*